United States Patent
Kashiwagi et al.

(10) Patent No.: US 10,152,073 B2
(45) Date of Patent: Dec. 11, 2018

(54) POWER DISTRIBUTION MANAGEMENT APPARATUS AND ABNORMALITY DETECTION METHOD

(71) Applicant: FUJITSU LIMITED, Kawasaki-shi, Kanagawa (JP)

(72) Inventors: Tetsuya Kashiwagi, Fukuoka (JP); Yuichi Matsufuji, Fukuoka (JP); Sari Kawashima, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 432 days.

(21) Appl. No.: 14/672,644

(22) Filed: Mar. 30, 2015

(65) Prior Publication Data
US 2015/0205317 A1 Jul. 23, 2015

Related U.S. Application Data

(63) Continuation of application No. PCT/JP2012/075436, filed on Oct. 1, 2012.

(51) Int. Cl.
| | |
|---|---|
| *G05F 1/66* | (2006.01) |
| *G01R 19/25* | (2006.01) |
| *G05B 15/02* | (2006.01) |
| *H02J 13/00* | (2006.01) |

(52) U.S. Cl.
CPC ........... *G05F 1/66* (2013.01); *G01R 19/2513* (2013.01); *G05B 15/02* (2013.01); *H02J 13/0086* (2013.01)

(58) Field of Classification Search
None
See application file for complete search history.

(56) References Cited

U.S. PATENT DOCUMENTS

| | | | |
|---|---|---|---|
| 6,347,027 B1 * | 2/2002 | Nelson | H02H 1/0092 361/64 |
| 2005/0251296 A1 * | 11/2005 | Tracy Nelson | G06Q 10/06 700/292 |
| 2008/0106425 A1 | 5/2008 | Deaver et al. | |
| 2009/0281679 A1 | 11/2009 | Taft et al. | |

(Continued)

FOREIGN PATENT DOCUMENTS

| | | |
|---|---|---|
| JP | 05-153269 A | 6/1993 |
| JP | 11-027184 A | 1/1999 |
| JP | 2008-107870 A | 5/2008 |

(Continued)

OTHER PUBLICATIONS

Japanese Office Action dated May 24, 2016 for corresponding Japanese Patent Application No. 2014-539502, with Partial English Translation, 7 pages.

(Continued)

*Primary Examiner* — Ryan A Jarrett
(74) *Attorney, Agent, or Firm* — Fujitsu Patent Center

(57) ABSTRACT

A power distribution management apparatus includes an acquisition unit and a detection unit. The acquisition unit is configured to acquire predetermined data at a predetermined interval from meters classified into a predetermined group, the data containing power consumption. The detection unit is configured to detect, as an abnormal place, a facility of a power distribution system associated with the group when the predetermined data is not acquired within the predetermined interval from the respective meters included in the group.

12 Claims, 28 Drawing Sheets

(56) References Cited

U.S. PATENT DOCUMENTS

2010/0013632 A1    1/2010    Salewske et al.
2013/0204452 A1    8/2013    Yamaguchi et al.

FOREIGN PATENT DOCUMENTS

| JP | 2009-79935 A | 4/2009 |
|----|--------------|--------|
| JP | 2011-176934 A | 9/2011 |
| JP | 2011-525787 A | 9/2011 |
| JP | 2012-22399 A | 2/2012 |
| JP | 2012-65422 A | 3/2012 |
| WO | 2009-135940 A2 | 11/2009 |
| WO | 2012-111373 A1 | 8/2012 |

OTHER PUBLICATIONS

International Search Report, mailed in connection with PCT/JP2012/075436 and dated Dec. 25, 2012 (6 pages).

Extended European Search Report dated Apr. 26, 2016 for corresponding European Patent Application No. 12886024.4, 7 pages.

\* cited by examiner

FIG.4

| POSITION ID | POSITION TYPE | LONGITUDE | LATITUDE |
|---|---|---|---|
| SS0001 | SS | 502723016 | 128084866 |
| PO0001 | POLE | 502723021 | 128084176 |
| PO0002 | POLE | 502723031 | 128083227 |
| PO0003 | POLE | 502724066 | 128083262 |
| PO0004 | POLE | 502725091 | 128083296 |
| PO0005 | POLE | 502726033 | 128083331 |
| PO0006 | POLE | 502726840 | 128083382 |
| PO0007 | POLE | 502727844 | 128083430 |
| PO0008 | POLE | 502728620 | 128083503 |
| LL0001 | LOADL | 502728677 | 128083736 |
| PO0009 | POLE | 502729231 | 128083641 |
| PO0010 | POLE | 502729304 | 128084383 |
| PO0011 | POLE | 502729179 | 128084814 |
| LL0002 | LOADL | 502729402 | 128085012 |
| PO0012 | POLE | 502728879 | 128085361 |
| PO0013 | POLE | 502728620 | 128085900 |
| LL0003 | LOADL | 502729298 | 128086064 |
| LL0004 | LOADL | 502729174 | 128086288 |
| LL0005 | LOADL | 502729133 | 128085547 |
| PO0014 | POLE | 502725019 | 128082520 |
| LL0006 | LOADL | 502724661 | 128082339 |
| PO0015 | POLE | 502725112 | 128081757 |
| PO0016 | POLE | 502725122 | 128081244 |
| LL0007 | LOADL | 502724765 | 128081321 |
| LL0008 | LOADL | 502724744 | 128081718 |

| FACILITY ID | POSITION ID | TYPE | ATTRIBUTE INFORMATION |
|---|---|---|---|
| PO0001 P1 | PO0001 | POLE | ... |
| PO0001 01 | PO0001 | SW | ... |
| PO0002 P1 | PO0002 | POLE | ... |
| PO0003 P1 | PO0003 | POLE | ... |
| PO0004 P1 | PO0004 | POLE | ... |
| PO0004 01 | PO0004 | SW | ... |
| PO0005 P1 | PO0005 | POLE | ... |
| PO0006 P1 | PO0006 | POLE | ... |
| PO0007 P1 | PO0007 | POLE | ... |
| PO0007 01 | PO0007 | BANK | RESISTANCE (36800 Ω), REACTANCE (31300 Ω), VOLTAGE RATIO 1 |
| PO0008 P1 | PO0008 | POLE | ... |
| LL0001 01 | LL0001 | LOADL | ... |
| PO0009 P1 | PO0009 | POLE | ... |
| PO0009 01 | PO0009 | SW | ... |
| PO0010 P1 | PO0010 | POLE | ... |
| PO0011 P1 | PO0011 | POLE | ... |
| LL0002 01 | LL0002 | LOADL | ... |
| PO0012 P1 | PO0012 | POLE | ... |
| PO0012 01 | PO0012 | BANK | RESISTANCE (36800 Ω), REACTANCE (31300 Ω), VOLTAGE RATIO 2 |
| PO0013 P1 | PO0013 | POLE | ... |
| LL0003 01 | LL0003 | LOADL | ... |
| LL0004 01 | LL0004 | LOADL | ... |
| LL0005 01 | LL0005 | LOADL | ... |
| PO0014 P1 | PO0014 | POLE | ... |
| LL0006 01 | LL0006 | LOADL | ... |
| PO0015 P1 | PO0015 | POLE | ... |
| PO0015 01 | PO0015 | BANK | RESISTANCE (36800 Ω), REACTANCE (31300 Ω), VOLTAGE RATIO 3 |
| PO0016 P1 | PO0016 | POLE | ... |
| LL0007 01 | LL0007 | LOADL | ... |
| LL0008 01 | LL0008 | LOADL | ... |

FIG.6

| FACILITY ID | POSITION ID₁ | POSITION ID₂ | TYPE | ATTRIBUTE INFORMATION | | |
|---|---|---|---|---|---|---|
| | | | | SPAN SIZE | RESIST-ANCE (R) | REACTANCE (X) |
| SP0001 | SS0001 | PO0001 | 3H | 21 | 220 | 150 |
| SP0002 | PO0001 | PO0002 | 3H | 29 | 220 | 150 |
| SP0003 | PO0002 | PO0003 | 3H | 32 | 220 | 150 |
| SP0004 | PO0003 | PO0004 | 3H | 32 | 220 | 150 |
| SP0005 | PO0004 | PO0005 | 3H | 29 | 220 | 150 |
| SP0006 | PO0005 | PO0006 | 3H | 25 | 220 | 150 |
| SP0007 | PO0006 | PO0007 | 3H | 31 | 220 | 150 |
| SP0008 | PO0007 | PO0008 | 3H | 24 | 220 | 150 |
| SP0009 | PO0007 | PO0008 | 3L | 24 | 390 | 240 |
| SP0010 | PO0008 | LL0001 | | 7 | 510 | 820 |
| SP0011 | PO0008 | PO0009 | 3H | 19 | 220 | 150 |
| SP0012 | PO0009 | PO0010 | 3H | 23 | 220 | 150 |
| SP0013 | PO0010 | PO0011 | 3H | 14 | 220 | 150 |
| SP0014 | PO0012 | PO0011 | 3L | 19 | 390 | 240 |
| SP0015 | PO0011 | LL0002 | | 9 | 510 | 820 |
| SP0016 | PO0011 | PO0012 | 3H | 19 | 220 | 150 |
| SP0017 | PO0012 | PO0013 | 3L | 18 | 390 | 240 |
| SP0018 | PO0013 | LL0003 | | 22 | 510 | 820 |
| SP0019 | PO0013 | LL0004 | | 21 | 510 | 820 |
| SP0020 | PO0012 | LL0005 | | 10 | 510 | 820 |
| SP0021 | PO0004 | PO0014 | 3H | 24 | 220 | 150 |
| SP0022 | PO0015 | PO0014 | 3L | 24 | 390 | 240 |
| SP0023 | PO0014 | LL0006 | | 12 | 510 | 820 |
| SP0024 | PO0014 | PO0015 | 3H | 24 | 220 | 150 |
| SP0025 | PO0015 | PO0016 | 3L | 16 | 390 | 240 |
| SP0026 | PO0016 | LL0007 | | 11 | 510 | 820 |
| SP0027 | PO0015 | LL0008 | | 11 | 510 | 820 |

FIG.7

| NODE ID | POSITION ID |
|---|---|
| SS0001 N01 | SS0001 |
| PO0001 N01 | PO0001 |
| PO0001 N02 | PO0001 |
| PO0002 N01 | PO0002 |
| PO0003 N01 | PO0003 |
| PO0004 N01 | PO0004 |
| PO0004 N02 | PO0004 |
| PO0005 N01 | PO0005 |
| PO0006 N01 | PO0006 |
| PO0007 N01 | PO0007 |
| PO0007 N02 | PO0007 |
| PO0008 N01 | PO0008 |
| PO0008 N02 | PO0008 |
| LL0001 N01 | LL0001 |
| PO0009 N01 | PO0009 |
| PO0009 N02 | PO0009 |
| PO0010 N01 | PO0010 |
| PO0011 N01 | PO0011 |
| PO0011 N02 | PO0011 |
| LL0002 N01 | LL0002 |
| PO0012 N01 | PO0012 |
| PO0012 N02 | PO0012 |
| PO0013 N01 | PO0013 |
| LL0003 N01 | LL0003 |
| LL0004 N01 | LL0004 |
| LL0005 N01 | LL0005 |
| PO0014 N01 | PO0014 |
| PO0014 N02 | PO0014 |
| LL0006 N01 | LL0006 |
| PO0015 N01 | PO0015 |
| PO0015 N02 | PO0015 |
| PO0016 N01 | PO0016 |
| LL0007 N01 | LL0007 |
| LL0008 N01 | LL0008 |

FIG.8

| BRANCH ID | NODE ID₁ | NODE ID₂ | FACILITY ID | OPEN/ CLOSE DIVISION |
|---|---|---|---|---|
| BR0001 | SS0001 N01 | PO0001 N01 | SP0001 | |
| BR0002 | PO0001 N01 | PO0001 N02 | PO0001 01 | 1 |
| BR0003 | PO0001 N02 | PO0002 N01 | SP0002 | |
| BR0004 | PO0002 N01 | PO0003 N01 | SP0003 | |
| BR0005 | PO0003 N01 | PO0004 N01 | SP0004 | |
| BR0006 | PO0004 N01 | PO0004 N02 | PO0004 01 | 1 |
| BR0007 | PO0004 N02 | PO0005 N01 | SP0005 | |
| BR0008 | PO0005 N01 | PO0006 N01 | SP0006 | |
| BR0009 | PO0006 N01 | PO0007 N01 | SP0007 | |
| BR0010 | PO0007 N01 | PO0007 N02 | PO0007 01 | |
| BR0011 | PO0007 N01 | PO0008 N01 | SP0008 | |
| BR0012 | PO0007 N02 | PO0008 N02 | SP0009 | |
| BR0013 | PO0008 N02 | LL0001 N01 | SP0010 | |
| BR0014 | LL0001 N01 | | LL0001 01 | |
| BR0018 | PO0008 N01 | PO0009 N01 | SP0011 | |
| BR0019 | PO0009 N01 | PO0009 N02 | PO0009 01 | 1 |
| BR0020 | PO0009 N02 | PO0010 N01 | SP0012 | |
| BR0021 | PO0010 N01 | PO0011 N01 | SP0013 | |
| BR0022 | PO0012 N02 | PO0011 N02 | SP0014 | |
| BR0023 | PO0011 N02 | LL0002 N01 | SP0015 | |
| BR0024 | LL0002 N01 | | LL0002 01 | |
| BR0028 | PO0011 N01 | PO0012 N01 | SP0016 | |
| BR0029 | PO0012 N01 | PO0012 N02 | PO0012 01 | |
| BR0030 | PO0012 N02 | PO0013 N01 | SP0017 | |
| BR0031 | PO0013 N01 | LL0003 N01 | SP0018 | |
| BR0032 | LL0003 N01 | | LL0003 01 | |
| BR0036 | PO0013 N01 | LL0004 N01 | SP0019 | |
| BR0037 | LL0004 N01 | | LL0004 01 | |
| BR0041 | PO0012 N02 | LL0005 N01 | SP0020 | |
| BR0042 | LL0005 N01 | | LL0005 01 | |
| BR0046 | PO0004 N01 | PO0014 N01 | SP0021 | |
| BR0047 | PO0015 N02 | PO0014 N02 | SP0022 | |
| BR0048 | PO0014 N02 | LL0006 N01 | SP0023 | |
| BR0049 | LL0006 N01 | | LL0006 01 | |
| BR0053 | PO0014 N01 | PO0015 N01 | SP0024 | |
| BR0054 | PO0015 N01 | PO0015 N02 | PO0015 01 | |
| BR0055 | PO0015 N02 | PO0016 N01 | SP0025 | |
| BR0056 | PO0016 N01 | LL0007 N01 | SP0026 | |
| BR0057 | LL0007 N01 | | LL0007 01 | |
| BR0061 | PO0015 N02 | LL0008 N01 | SP0027 | |
| BR0062 | LL0008 N01 | | LL0008 01 | |

FIG.9

| CONNEC-TION ID | POSI-TION ID | POWER CONSUMPTION (EFFECTIVE) | POWER CONSUMPTION (REACTIVE) |
|---|---|---|---|
| SS0001 N01 | SS0001 | | |
| PO0001 N01 | PO0001 | | |
| PO0001 N02 | PO0001 | | |
| PO0002 N01 | PO0002 | | |
| PO0003 N01 | PO0003 | | |
| PO0004 N01 | PO0004 | | |
| PO0004 N02 | PO0004 | | |
| PO0005 N01 | PO0005 | | |
| PO0006 N01 | PO0006 | | |
| PO0007 N01 | PO0007 | | |
| PO0007 N02 | PO0007 | | |
| PO0008 N01 | PO0008 | | |
| PO0008 N02 | PO0008 | | |
| LL0001 N01 | LL0001 | 200 | 20 |
| PO0009 N01 | PO0009 | | |
| PO0009 N02 | PO0009 | | |
| PO0010 N01 | PO0010 | | |
| PO0011 N01 | PO0011 | | |
| PO0011 N02 | PO0011 | | |
| LL0002 N01 | LL0002 | 220 | 22 |
| PO0012 N01 | PO0012 | | |
| PO0012 N02 | PO0012 | | |
| PO0013 N01 | PO0013 | | |
| LL0003 N01 | LL0003 | 180 | 18 |
| LL0004 N01 | LL0004 | 240 | 24 |
| LL0005 N01 | LL0005 | 210 | 21 |
| PO0014 N01 | PO0014 | | |
| PO0014 N02 | PO0014 | | |
| LL0006 N01 | LL0006 | 300 | 30 |
| PO0015 N01 | PO0015 | | |
| PO0015 N02 | PO0015 | | |
| PO0016 N01 | PO0016 | | |
| LL0007 N01 | LL0007 | 240 | 24 |
| LL0008 N01 | LL0008 | 230 | 23 |

| BRANCH ID | NODE ID₁ | NODE ID₂ | FACILITY ID | OPEN/ CLOSE DIVISION | REACTANCE (X) | RESIST-ANCE (R) |
|---|---|---|---|---|---|---|
| BR0001 | SS0001 N01 | PO0001 N01 | SP0001 | | 3150 | 4620 |
| BR0002 | PO0001 N01 | PO0001 N02 | PO0001 01 | 1 | 0 | 0 |
| BR0003 | PO0001 N02 | PO0002 N01 | SP0002 | | 4350 | 6380 |
| BR0004 | PO0002 N01 | PO0003 N01 | SP0003 | | 4800 | 7040 |
| BR0005 | PO0003 N01 | PO0004 N01 | SP0004 | | 4800 | 7040 |
| BR0006 | PO0004 N01 | PO0004 N02 | PO0004 01 | 1 | 0 | 0 |
| BR0007 | PO0004 N02 | PO0005 N01 | SP0005 | | 4350 | 6380 |
| BR0008 | PO0005 N01 | PO0006 N01 | SP0006 | | 3750 | 5500 |
| BR0009 | PO0006 N01 | PO0007 N01 | SP0007 | | 4650 | 6820 |
| BR0010 | PO0007 N01 | PO0007 N02 | PO0007 01 | | 31300 | 36800 |
| BR0011 | PO0007 N01 | PO0008 N01 | SP0008 | | 3600 | 5280 |
| BR0012 | PO0007 N02 | PO0008 N02 | SP0009 | | 5760 | 9360 |
| BR0013 | PO0008 N02 | LL0001 N01 | SP0010 | | 5740 | 3570 |
| BR0014 | LL0001 N01 | | LL0001 01 | | 0 | 0 |
| BR0018 | PO0008 N01 | PO0009 N01 | SP0011 | | 2850 | 4180 |
| BR0019 | PO0009 N01 | PO0009 N02 | PO0009 01 | 1 | 0 | 0 |
| BR0020 | PO0009 N02 | PO0010 N01 | SP0012 | | 3450 | 5060 |
| BR0021 | PO0010 N01 | PO0011 N01 | SP0013 | | 2100 | 3080 |
| BR0022 | PO0012 N02 | PO0011 N02 | SP0014 | | 4560 | 7410 |
| BR0023 | PO0011 N02 | LL0002 N01 | SP0015 | | 7380 | 4590 |
| BR0024 | LL0002 N01 | | LL0002 01 | | 0 | 0 |
| BR0028 | PO0011 N01 | PO0012 N01 | SP0016 | | 2850 | 4180 |
| BR0029 | PO0012 N01 | PO0012 N02 | PO0012 01 | | 31300 | 36800 |
| BR0030 | PO0012 N02 | PO0013 N01 | SP0017 | | 4320 | 7020 |
| BR0031 | PO0013 N01 | LL0003 N01 | SP0018 | | 18040 | 11220 |
| BR0032 | LL0003 N01 | | LL0003 01 | | 0 | 0 |
| BR0036 | PO0013 N01 | LL0004 N01 | SP0019 | | 17220 | 10710 |
| BR0037 | LL0004 N01 | | LL0004 01 | | 0 | 0 |
| BR0041 | PO0012 N02 | LL0005 N01 | SP0020 | | 8200 | 5100 |
| BR0042 | LL0005 N01 | | LL0005 01 | | 0 | 0 |
| BR0046 | PO0004 N01 | PO0014 N01 | SP0021 | | 3600 | 5280 |
| BR0047 | PO0015 N02 | PO0014 N02 | SP0022 | | 5760 | 9360 |
| BR0048 | PO0014 N02 | LL0006 N01 | SP0023 | | 9840 | 6120 |
| BR0049 | LL0006 N01 | | LL0006 01 | | 0 | 0 |
| BR0053 | PO0014 N01 | PO0015 N01 | SP0024 | | 3600 | 5280 |
| BR0054 | PO0015 N01 | PO0015 N02 | PO0015 01 | | 31300 | 36800 |
| BR0055 | PO0015 N02 | PO0016 N01 | SP0025 | | 3840 | 6240 |
| BR0056 | PO0016 N01 | LL0007 N01 | SP0026 | | 9020 | 5610 |
| BR0057 | LL0007 N01 | | LL0007 01 | | 0 | 0 |
| BR0061 | PO0015 N02 | LL0008 N01 | SP0027 | | 9020 | 5610 |
| BR0062 | LL0008 N01 | | LL0008 01 | | 0 | 0 |

FIG.13

| FACILITY ID | DATE | TIME | POWER CON-SUMPTION 18a |
|---|---|---|---|
| LL1 | 2012/9/5 | 15:10:19 | U12 |
| LL4 | 2012/9/5 | 14:42:33 | U40 |
| LL3 | 2012/9/5 | 14:40:29 | U30 |
| LL1 | 2012/9/5 | 14:40:18 | U11 |
| LL2 | 2012/9/5 | 14:38:59 | U20 |
| ⋮ | ⋮ | ⋮ | ⋮ |

FIG.14

| NODE ID | ENERGIZ-ING STATE 17a |
|---|---|
| N1 | 1 |
| N2 | 1 |
| N3 | 1 |
| N4 | 1 |
| N5 | 1 |
| N6 | 1 |
| N7 | 1 |
| N8 | 1 |
| N9 | 1 |
| N10 | 1 |

FIG.15

| BRANCH ID | NODE ID$_1$ | NODE ID$_2$ | FACILITY ID | ... |
|---|---|---|---|---|
| B1 | N1 | N2 | SP1 | ... |
| B2 | N2 | N3 | SW1 | ... |
| B3 | N3 | N4 | SP2 | ... |
| B4 | N4 | N5 | TR1 | ... |
| B5 | N5 | N6 | SP3 | ... |
| B6 | N6 | N7 | SP4 | ... |
| B7 | N7 | – | LL1 | ... |
| B8 | N5 | N8 | SP5 | ... |
| B9 | N8 | N9 | SP6 | ... |
| B10 | N9 | – | LL2 | ... |
| B11 | N8 | N10 | SP7 | ... |
| B12 | N10 | – | LL3 | ... |
| B13 | N10 | – | LL4 | ... |

17b

POWER DISTRIBUTION MANAGEMENT APPARATUS AND ABNORMALITY DETECTION METHOD

CROSS-REFERENCE TO RELATED APPLICATION

This application is a continuation of International Application No. PCT/JP2012/075436, filed on Oct. 1, 2012 and designating the U.S., the entire contents of which are incorporated herein by reference.

FIELD

The present invention relates to a power distribution management apparatus and an abnormality detection method.

BACKGROUND

In a power distribution system, there may occur a blackout due to an abnormality such as an accident or a failure. As a technology of coping with such a blackout, there is proposed a remote-control switch or a time-limit switch. For example, the remote-control switch switches electrical connection of the power distribution system such that power is supplied to a section of another switch except a section of a switch including a facility in which an abnormality occurs. In addition, when receiving power again after power transmission from a substation is disconnected due to the blackout, the time-limit switch enters a close state after a certain time period elapses from the power retransmission, and then is locked in an open state in a case where the power transmission is stopped within a certain time. These switches are used for suppressing a blackout range into a section partitioned by the switches.

Patent Literature 1: Japanese National Publication of International Patent Application No. 2011-525787

However, the above technology has a problem in that it is not possible to specify an abnormal item of the power distribution system as to be described below.

In other words, the above switches are merely used to suppress the blackout range into a section partitioned by the switches. For this reason, even when the switch is operated during the blackout, it is difficult to detect a facility which is abnormal in the section of the switches. Likewise, in a case where an abnormal item is obscure, swift restoration is disrupted and thus the blackout may be extended.

SUMMARY

According to an aspect of an embodiment of the present invention, a power distribution management apparatus includes an acquisition unit and a detection unit. The acquisition unit is configured to acquire predetermined data at a predetermined interval from meters classified into a predetermined group, the data containing power consumption. The detection unit is configured to detect, as an abnormal item, a facility of a power distribution system associated with the group when the predetermined data is not acquired within the predetermined interval from the respective meters included in the group.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 4 is a diagram illustrating an example of a "location" table.

FIG. 5 is a diagram illustrating en example of a "unit" table.

FIG. 6 is a diagram illustrating an example of a "span" table.

FIG. 7 is a diagram illustrating an example of a node table.

FIG. 8 is a diagram illustrating an example of a "branch" table.

FIG. 9 is a diagram illustrating an example of a current node table.

FIG. 10 is a diagram illustrating an example of a current "branch" table.

FIG. 13 is a diagram illustrating an example of a load table.

FIG. 14 is a diagram illustrating an example of a current node table.

FIG. 15 is a diagram illustrating an example of a current "branch" table.

DESCRIPTION OF EMBODIMENTS

A power distribution management apparatus, an abnormality detection method, and an abnormality detection program according to the present application will be described with reference to the accompanying drawings. Further, embodiments herein do not limit the disclosed technology. Then, the respective embodiments can be implemented by appropriately combining each other in a scope where the processing contents are compatible.

First Embodiment

Configuration of Power Distribution Management Apparatus

Figure 1:
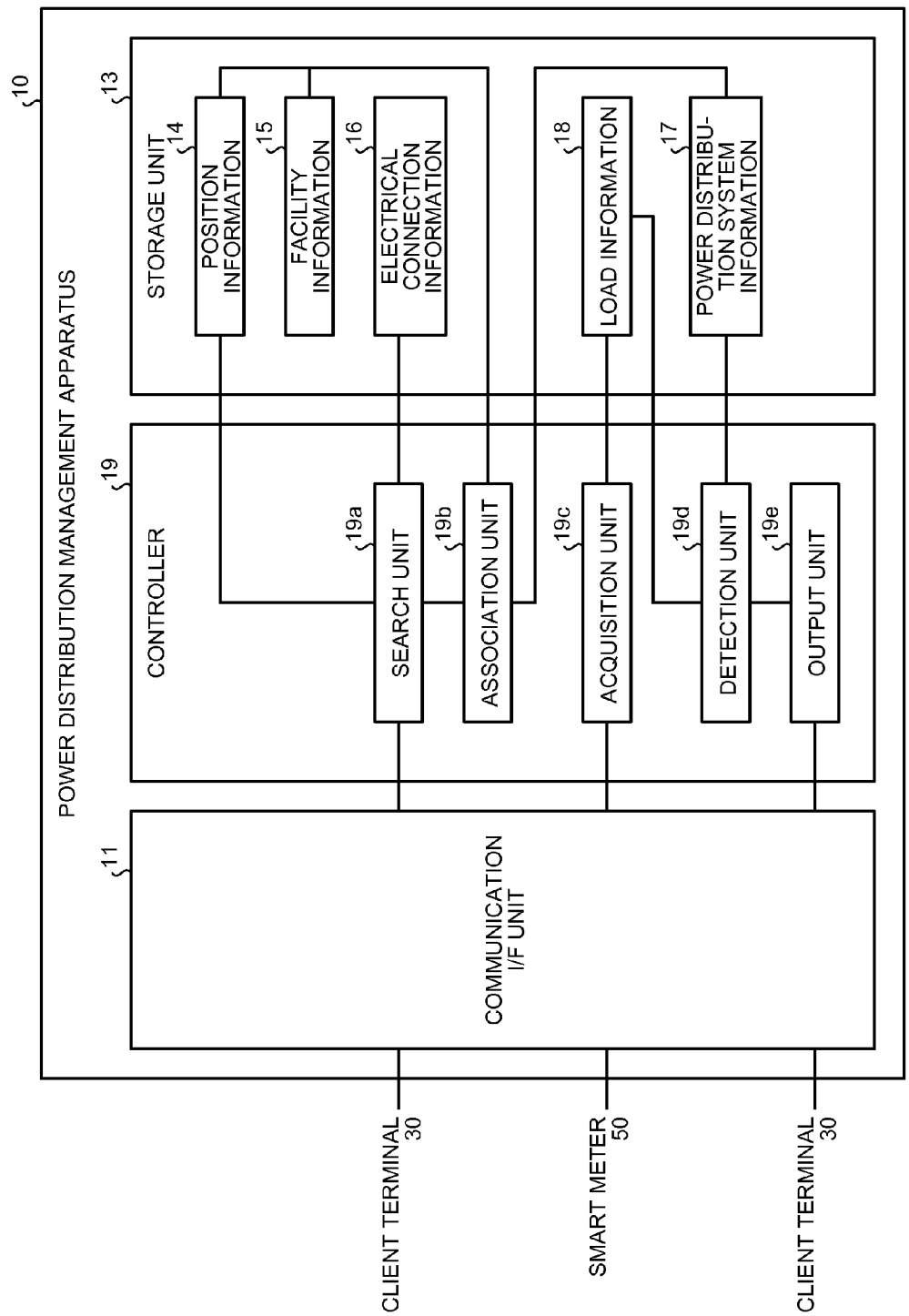
FIG. 1 is a block diagram illustrating a functional configuration of a power distribution management apparatus according to a first embodiment.

FIG. 1 is a block diagram illustrating a functional configuration of a power distribution management apparatus according to a first embodiment. A power distribution management apparatus 10 illustrated in FIG. 1 is an apparatus which performs an abnormality detection process. In the abnormality detection process, an abnormal facility is detected in a case where an abnormality occurs in a facility included in a power distribution system between a substation of an electric power provider and a load facility of a customer.

As an aspect of such power distribution management apparatus 10, a Web server may be mounted to perform the abnormality detection process, or an outsourcing cloud may be mounted to provide a service relating to the abnormality detection process. As another aspect, there may be provided a desired computer in which a power distribution management program provided as package software or online software is preinstalled or installed.

As illustrated in FIG. 1, the power distribution management apparatus 10 is connected for communication with another apparatus such as a client terminal 30 or a smart meter 50 through a predetermined network. As such a network, any type of communication network such as the Internet, a LAN (Local Area Network), or a VPN (Virtual Private Network) may be employed regardless of whether the network is wired or wireless. Further, the number of the client terminals 30 and the smart meters 50 may be arbitrarily set in the connection.

Among these, the client terminal 30 is a terminal apparatus which receives the abnormality detection service. As an example of such client terminal 30, besides a fixed terminal including a personal computer (PC), a movable terminal such as a portable telephone, a PHS (Personal Handyphone System), or a PDA (Personal Digital Assistant) can also be employed. Further, the client terminal 30 is used by a member (for example, a person in charge or a manager for the power distribution section) of the electric power provider.

The smart meter 50 is a power meter having a communication function. The smart meter 50 is connected to a distribution board of a customer. As an aspect, the smart meter 50 measures the power used by the load facility of the customer at every predetermined time period (for example, 30 minutes). At this time, the smart meter 50 performs the measurement by accumulating the power consumed by the load facility. In the following, the accumulated value of power consumed in the load facility may be referred to as "power consumption". Furthermore, the smart meter 50 transmits the power consumption to the power distribution management apparatus 10. Further, the description herein has been made about an example in which the smart meter 50 uploads the power consumption at every predetermined time period, but the power consumption may be intermittently uploaded. In addition, the smart meter 50 may upload the power consumption in response to a request from the power distribution management apparatus 10 without actively uploading the power consumption.

As illustrated in FIG. 1, the power distribution management apparatus 10 includes a communication I/F (interface) unit 11, a storage unit 13, and a controller 19. Further, besides the functional units illustrated in FIG. 1, the power distribution management apparatus 10 may include various types of functional units (for example, functional units such as various types of input/output devices or an image pickup device) included in a well-known computer.

The communication I/F unit 11 is an interface for performing communication control with respect to other apparatuses (for example, the client terminal 30 or the smart meter 50). As an aspect of such communication I/F unit 11, a network interface card such as a LAN card can be employed. For example, the communication I/F unit 11 receives a browse request for various types of information from the client terminal 30, or notifies informing of an abnormal item of the power distribution system from the power distribution management apparatus 10 to the client terminal 30. In addition, the communication I/F unit 11 receives the power consumption from the smart meter 50, or transmits a transmission request for the power consumption to the smart meter 50.

The storage unit 13 is a storage device which stores various types of programs such as an OS (Operating System) performed by the controller 19 and the abnormality detection program. As an aspect of the storage unit 13, a semiconductor memory element such as flash memory and a storage device such as a hard disk and an optical disk are exemplified. Further, the storage unit 13 is not limited to the above-mentioned storage devices, and may be RAM (Random Access Memory) or ROM (Read Only Memory).

The storage unit 13 stores position information 14, facility information 15, electrical connection information 16, power distribution system information 17, and load information 18 as an example of data used in the program executed by the controller 19. Further, besides the information as described above, another electronic data (for example, map information containing the power distribution system managed by the electric power provider) can also be stored.

Herein, in the power distribution management apparatus 10 according to the embodiment, the power distribution system is managed into three divisions as follows: a position management in which a location of the facility is managed, a facility management in which each facility is managed, and an electrical connection management in which the facilities electrically connected to each other are managed.

Among them, in the position management, a position "location" at which a predetermined facility (for example, a power substation, a power pole, a transformer, and the like) is provided among the facilities forming the power distribution system is used as an entity. In addition, in the facility management, a facility "unit" linked at a position of one of the facilities forming the power distribution system and a facility "span" linked at two positions are used as an entity. In addition, in the electrical connection management, a junction "node" at which the facilities are electrically connected to each other and a facility "branch" determined from a plurality of junctions are used as an entity.

Figure 2:
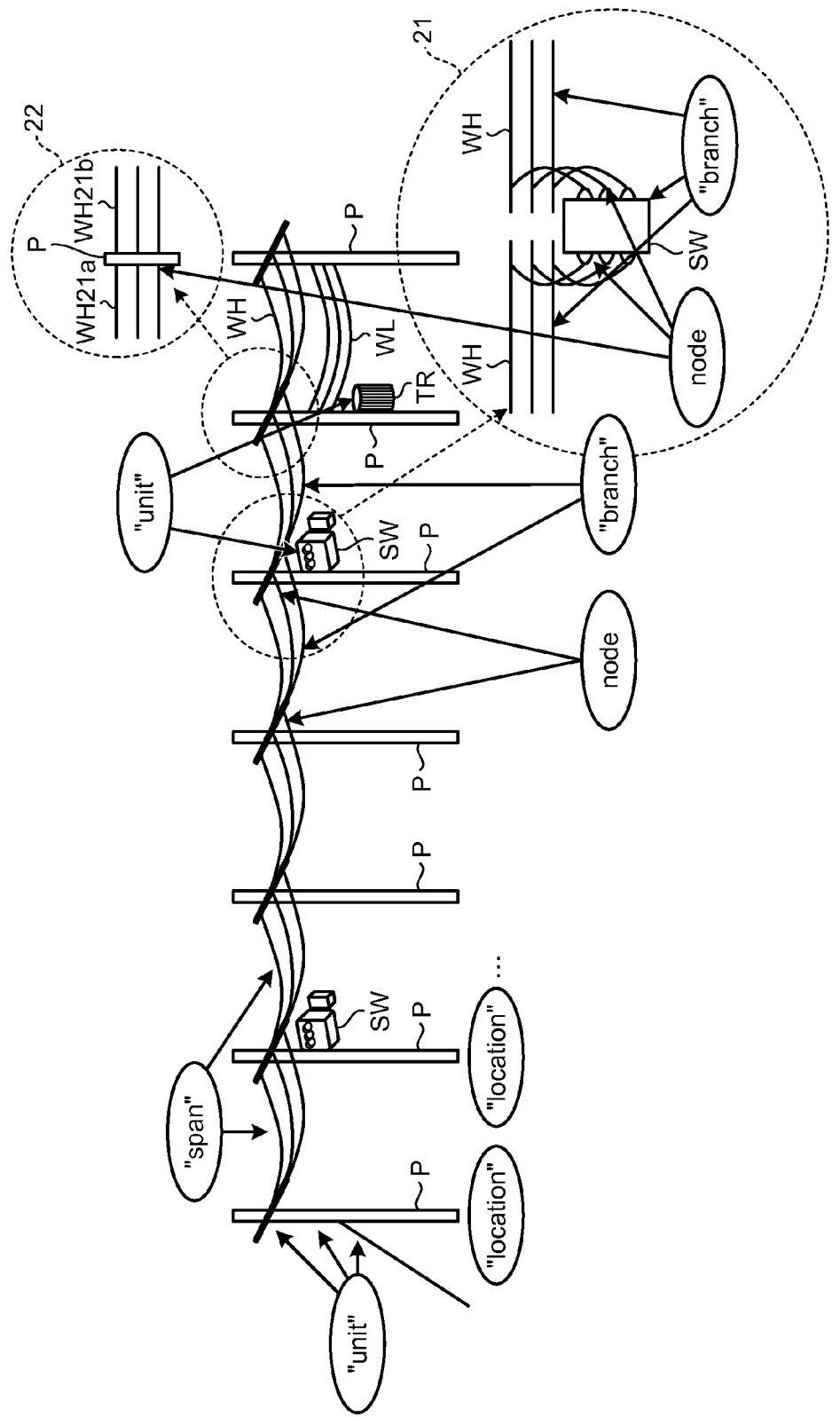
FIG. 2 is a diagram illustrating an aspect of entities.

FIG. 2 is a diagram illustrating an aspect of the entities. As illustrated in FIG. 2, as an example of the "location", for example, there is a position where a non-installation facility (such as a power pole P and a pole transformer TR) not in an installation state is provided. Besides, a position of a power distribution substation (SS) not illustrated) or a position of the transformer is also included in a category of the "location".

As an example of a "unit", there are the power pole P, a switch SW, the pole transformer TR, and the like. Besides, while not being illustrated, the power distribution substation, an SVR (Step Voltage Regulator), and various types of meters (for example, the smart meter 50) are also included in a category of the "unit".

As an example of the "span", there is a wire (so-called "high-voltage wire") WH laid on the high-voltage system through which high power is distributed between the power distribution substation and the pole transformer TR. As another example of the "span", there is a wire (so-called "lead-in wire") laid on a section from the lead-in wire to the load facility, in addition to a wire (so-called "low-voltage wire") WL laid on a section from the pole transformer TR to the lead-in wire in the low-voltage system through which low power is distributed between the pole transformer TR and the load facility of the customer. Further, regarding the wire W such as the high-voltage wire WH and the low-voltage wire WL, the number (for example, 3 or 2) of installation units of the power pole P can be collectively handled as one "span".

As an example of the node, there are a junction between the high-voltage wire WH and the switch SW illustrated in an enlarged view 21 in FIG. 2, a junction between the high-voltage wire WH and the pole transformer TR, and a junction between the pole transformer TR and the low-voltage wire WL. Besides, a connection point between the high-voltage wire WH21a and the high-voltage wire WH21b illustrated in an enlarged view 22 of FIG. 2 is also included in a category of the node. Specifically, even in a case where the high-voltage wire WH21a and the high-voltage wire WH21b are installed in the power pole P as a through pole, the high-voltage wire WH21a and the high-voltage wire WH21b are considered to be electrically connected, and a connection point between the high-voltage wires WH is considered as a virtual node.

As an example of the "branch", there are various types of facilities such as the power pole P, the high-voltage wire WH, the switch SW, the pole transformer TR, the low-voltage wire WL illustrated in FIG. 2. Besides, the power distribution substation, the lead-in wire, the smart meter 50, and the load facility (not illustrated) are also included in a category of the "branch". A facility positioned at the end point of the power distribution substation, the load facility, or the like may have one node.

Figure 3:
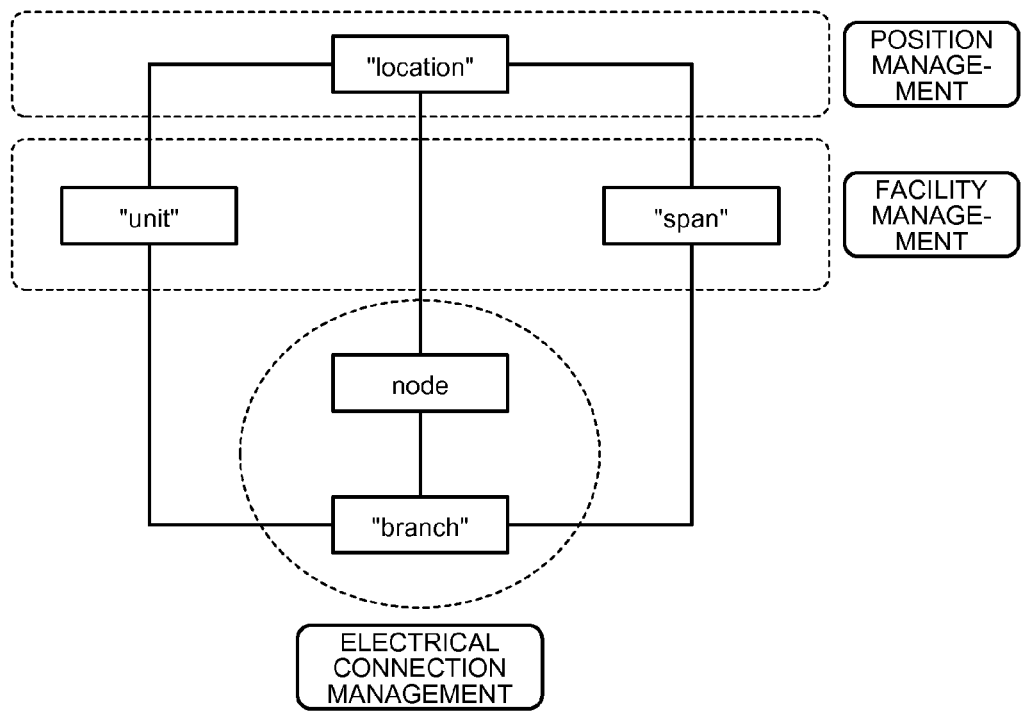
FIG. 3 is a diagram illustrating an example of a mutual relation of the entities.

The entities of the "location", the "unit", the "span", the node, and the "branch" have relevance as illustrated in FIG. 3. FIG. 3 is a diagram illustrating an example of a mutual relation of the entities. As illustrated in FIG. 3, the "location" is used for managing position information of the "unit" and the "span". In addition, the "branch" is used for managing facility information of the "unit" and the "span". Furthermore, the "location" and the "branch" are related by the node.

Returning to the description of FIG. 1, a "location" table 14a for managing the "location" is included in the position information 14. In addition, a "unit" table 15a for managing the "unit" and a "span" table 15b for managing the "span" are included in the facility information 15. Furthermore, a node table 16a for managing the node and a "branch" table 16b for managing the "branch" are included in the electrical connection information 16. In addition, as to be described below, a current node table 17a and a current "branch" table 17b are included in the power distribution system information 17.

Among them, as an aspect of the "location" table 14a, a table in which items such as a position ID (identifier), a position type, a longitude, and a latitude are associated can be employed. The "position ID" indicates identification information for identifying a position where the facility is provided. In addition, the "position type" indicates information for identifying a type of the position; for example, types of a power distribution substation (SS), a power pole (POLE), and a load facility (LOADL) are included. Further, the information stored in the "location" table 14a, for example, can acquire the position information of a specific facility such as the power substation, the power pole, and the transformer from another existing system (for example, an power distribution facility management system for managing the facilities in the power distribution system).

FIG. 4 is a diagram illustrating an example of the "location" table 14a. For example, a "location" of the position ID "SS0001" illustrated in FIG. 4 means that the power distribution substation is positioned at 128°08'48.66" east longitude and at 50°27'23.016" north latitude. In addition, in the subsequent drawings of FIG. 4, various types of IDs are indexed by adding a string identifiable for the various types of facilities such as "SS" indicating the power distribution substation, "PO" indicating the power pole, and "LL" indicating the load facility to the head of a string forming the ID. The indexing of these various types of IDs is not limited to the indexing obtained by adding the string identifiable for the various types of facilities to the head of the string forming the ID, but may be assigned with values which can be uniquely recognized. Further, herein, the longitude and the latitude are exemplified as an item for specifying the position of the facility, but another item (for example, local coordinates, addresses, and the like) may be used.

As an aspect of the "unit" table 15a, a table in which items such as a facility ID, a position ID, a type, and attribute information are associated can be employed. The "facility ID" indicates identification information for identifying the facility, and only the facility ID of the "unit" is stored in the "unit" table 15a. In addition, the "type" indicates a type of the "unit"; for example, the power pole (POLE), the switch (SW), the pole transformer (BANK), and the load facility (LOADL) are included. In addition, the "attribute information" indicates information relating to an attribute of the "unit"; for example, a serial number or performance of the "unit" is included (for example, in a case where the "unit" is a transformer, the capacity of the transformer or a voltage ratio is registered). The capacity of the transformer or the voltage ratio can be used to calculate a voltage drop when the electrical connection information of the facility of the current system is extracted. For example, in a case where the "unit" is the transformer, a resistance value, a reactance value, and a voltage ratio of the transformer are registered. Further, the information stored in the "unit" table 15a, for example, is acquired from another existing system (for example, a power-distribution facility management system), and the attribute information of the facility classified into the "unit" among the acquired attribute information of the facility is registered.

FIG. 5 is a diagram illustrating an example of the "unit" table 15a. For example, the facility ID "PO0001P1" illustrated in FIG. 5 means that the "unit" is at a position corresponding to the position ID "PO0001" (that is, 128°08'41.76" east longitude and 50°27'23.021" north latitude illustrated in FIG. 4) and is the power pole. In addition, the facility ID "PO000101" illustrated in FIG. 5 means that the "unit" is at a position corresponding to the position ID "PO0001" (that is, 128°08'41.76" east longitude and 50°27'23.021" north latitude illustrated in FIG. 4) and is the switch. In addition, the facility ID "PO000701" illustrated in FIG. 5 means that the "unit" is at a position corresponding to the position ID "PO0007" (that is, 128°08'34.30" east longitude and 50°27'27.844" illustrated in FIG. 4), and is the pole transformer having a resistance value of "36800Ω", a reactance value of "31300Ω", and a voltage ratio of 1.

As an aspect of the "span" table 15$b$, a table in which items such as a facility ID, a position $ID_1$, a position $ID_2$, a type, and attribute information are associated can be employed. The "facility ID" herein also indicates the identification information for identifying the facility, and only the facility ID of the "span" is stored in the "span" table 15$b$. In addition, the "position $ID_1$" indicates the position ID of one of two position IDs linked to the "span", and the "position $ID_2$" indicates the position ID of the other one of two position IDs linked to the "span". In addition, the "type" indicates a type of the "span"; for example, the high-voltage wire, the low-voltage wire, and the lead-in wire are included. In addition, the "attribute information" indicates information relating to the attribute of the "span"; for example, a serial number of the "span", a thickness, a material, a span size, a resistance value per unit (m), and a reactance value per unit (m) are included. The span size, the resistance value per unit, and the reactance value per unit can be used to calculate a voltage drop when the electrical connection information of the facility of the current system is extracted. Further, the information stored in the "span" table 15$b$, for example, is acquired from another existing system (for example, the power-distribution facility management system), and the attribute information of the facility classified into the "span" among the acquired attribute information of the facility is registered.

FIG. 6 is a diagram illustrating an example of the "span" table 15$b$. For example, the facility ID "SP0001" illustrated in FIG. 6 means that the "span" is a three-phase high-voltage wire installed in a section at positions corresponding to the position $ID_1$ "SS0001" and the position $ID_2$ "PO0001. The section corresponds to a section from 128°08'48.66" east longitude and 50°27'23.016" north latitude to 128°08'41.76" east longitude and 50°27'23.021" north latitude as described using FIG. 4. Furthermore, the span size, the resistance value, and the reactance value of the facility ID "SP0001" mean "21 m", "220 Ω/m", and "150 Ω/m", respectively. Further, in a case where the type illustrated in FIG. 5 is 3 H, it means that the "span" is single-phase three high-voltage wires, and in a case where the type is 3 L, it means that the "span" is single-phase three low-voltage wires. In addition, in a case where the type is a blank, it means that the "span" is a lead-in wire.

As an aspect of the node table 16$a$, a table in which items such as a node ID and a position ID are associated can be employed. The "node ID" indicates the identification information for identifying the node. Further, the information stored in the node table 16$a$ is acquired from a power distribution automation system which performs a monitoring operation and a remote operation of the switch in another existing system (for example, the power-distribution facility management system and the power distribution system). For example, the node is extracted from the facility information of the low-voltage system acquired from the power-distribution facility management system or the facility information of the high-voltage system acquired from the power distribution automation system, and then the node is registered in the node table 16$a$ in association with a predetermined position.

FIG. 7 is a diagram illustrating an example of the node table 16$a$. For example, the node ID "SS0001N01" illustrated in FIG. 7 means that the junction is at a position corresponding to the position ID "SS0001" (that is, 128°08'48.66" east longitude and 50°27'23.016" north latitude illustrated in FIG. 4). In addition, the node IDs "PO0001N01" and "PO0001N02" illustrated in FIG. 7 mean that the junctions are at the same position corresponding to the position ID "PO0001" (that is, 128°08'41.76" east longitude and 50°27'23.021" north latitude illustrated in FIG. 4).

As an aspect of the "branch" table 16$b$, a table in which items such as a branch ID, a node $ID_1$, a node $ID_2$, a facility ID, and an open/close division are associated can be employed. The "branch ID" indicates the identification information for identifying the "branch". In addition, the "node $ID_1$" indicates one node ID of two node IDs of the "branch", and "the node $ID_2$" indicates the other node ID of two node IDs of the "branch". However, the "branch" positioned at the end point of the power distribution substation or the load facility may have any one node ID in the node $ID_1$ and the node $ID_2$. For example, regarding the node $ID_1$ and the node $ID_2$, the node ID on the primary side from the node $ID_2$ (that is, the node ID of the junction near the electric power substation) is registered in the node $ID_1$, and at the same time the node ID an the secondary side from the node $ID_1$ (that is, the node ID of the junction near the load facility) is registered in the node $ID_2$. In addition, the "facility ID" herein also indicates the identification information for identifying the facility, and the facility ID of any one of the "unit" and the "span" are stored in the "branch" table 16$b$. In addition, the "open/close division" indicates the open/close state of the switch. In the open/close division, in a case where the "branch" is a switch, an "open state" or a "close state" is set, but in a case where the "branch" is not the switch, a "blank" is registered.

Further, the information stored in the "branch" table 16$b$ is acquired from another existing system (for example, the power-distribution facility management system and the power distribution automation system). For example, after the "branch" is extracted out of the facility information of the low-voltage system acquired from the power-distribution facility management system or the facility information of the high-voltage system acquired from the power distribution automation system, the extracted "branch" is registered in the "branch" table 16$b$ in association with the node of the "branch".

FIG. 6 is a diagram illustrating an example of the "branch" table 16$b$. For example, the branch ID "BR0001" illustrated in FIG. 8 means that the "branch" is the high-voltage wire of the facility ID "SP0001" defined by the node $ID_1$ "SS0001N01" and the node $ID_2$ "PO0001N01". In addition, the branch ID "BR0002" illustrated in FIG. 8 means that the "branch" is the switch of the facility ID "PO000101" defined by the node $ID_1$ "PO0001N01" and the node $ID_2$ "PO0001N02", and since the open/close division is set to "1", it means that the switch is in the close state. Further, in a case where the open/close division illustrated in FIG. 8 is set to "0", it means that the switch is in the open state, and in a case where the open/close division is set to a blank, it means that the facility is not the switch. The close state of the switch indicates a conductive state, and the open state indicates a nonconductive state.

Further, in the information stored in the storage unit 13, the power distribution system information 17 and the load information 18 besides the position information 14, the facility information 15, and the electrical connection information 16 will be described below along with the descriptions of functional units serving to generate, acquire, or use these pieces of information.

The controller 19 includes an internal memory for storing programs defining various processes and control data, and executes various processes using these programs and data. As illustrated in FIG. 1, the controller 19 includes a search unit 19a, an association unit 19b, an acquisition unit 19c, a detection unit 19d, and an output unit 19e.

The search unit 19a is a processing unit which searches a "branch" corresponding to the subject combination with reference to the electrical connection information 16 while investigating an uninvestigated node among the nodes included in a node combination starting from a predetermined node.

As an aspect, the search unit 19a activates the process in a case where a browse request of the power distribution system information is received through the client terminal 30 or in a case where a certain time period elapses after the previous process is executed. First, the search unit 19a searches a position ID of which the position type is the power distribution substation "SS" among the position IDs stored in the "location" table 14a. Then, the search unit 19a registers the position ID of the power distribution substation SS investigated from the "location" table 14a in an investigation list stored in an internal memory (not illustrated). Besides the position ID of the power distribution substation SS as an investigation target, an uninvestigated node or an uninvestigated "branch" which is found out at the time of the Investigation is registered in the investigation list whenever it is founded out. Further, herein, a case of searching the position ID of the power distribution substation SS from the "location" table 14a has been exemplified, but it may be configured to search a node ID starting with "SS" in a string among the node IDs stored in the node table 16a or the "branch" table 16b.

Subsequently, the search unit 19a selects one position ID of the power distribution substation SS registered in the investigation list. Then, the search unit 19a searches a node corresponding to the position ID of the power distribution substation SS on which the selection is previously performed among the nodes stored in the node table 16a. Thereafter, the search unit 19a registers a record of the node searched from the node table 16a in the current node table 17a stored as the power distribution system information 17 in the storage unit 13. Furthermore, the search unit 19a registers the node searched from the node table 16a in the investigation list. Further, in a case where the power distribution substation SS includes a plurality of SS banks, even when the search is performed using one position ID, the records of the plurality of nodes are searched.

Then, the search unit 19a selects one node registered in the investigation list. Subsequently, the search unit 19a searches a record of the "branch" having a combination of the node IDs in which the previously-selected node is included (that is, a combination of the node $ID_1$ and the node $ID_2$) among the "branches" stored in the "branch" table 16b. Thereafter, the search unit 19a registers the record of the "branch" searched from the "branch" table 16b to the current "branch" table 17b stored as the power distribution system information 17 in the storage unit 13. Furthermore, the search unit 19a registers the "branch" searched from the "branch" table 16b in the investigation list. At this time, the one registered in the investigation list may be information for identifying the "branch". For example, at least one of the branch ID or the facility ID may be registered.

Subsequently, the search unit 19a selects one "branch" registered in the investigation list. Then, the search unit 19a searches the attribute information corresponding to the facility ID of the "branch" on which the selection is previously performed from the "span" table 15b. At this time, in a case where the "branch" is a "span", the attribute information can be searched from the "span" table 15b, but in a case where the "branch" is a "unit", it is not possible to search the attribute information. For this reason, in a case where it is not possible to search the attribute information from the "span" table 15b, the search unit 19a searches the attribute information corresponding to the facility ID of the "branch" on which the selection is previously performed, from the "unit" table 15a.

Thereafter, in a case where the other node paring with the node used in the investigation among the combination of the nodes is not a blank, the search unit 19a determines whether the subject "branch" is the switch. Then, in a case where the "branch" is a switch, the search unit 19a determines whether the switch is in the close state (that is, whether the open/close division is "1"). At this time, in a case where the switch is in the close state, the search unit 19a searches the record of the other node from the node table 16a and then registers the searched node in the current node table 17a of the power distribution system information 17. Furthermore, the search unit 19a adds the other node to the investigation list as the uninvestigated node.

Then, the search unit 19a repeatedly performs the processes from the selection of the uninvestigated "branch" to the current process until all the "branches" registered in the investigation list are investigated. Thereafter, when all the "branches" registered in the investigation list are investigated, the search unit 19a repeatedly performs the processes from the selection of the uninvestigated node to the current process until all the nodes registered in the investigation list are investigated. Then, the search unit 19a repeatedly performs the processes from the selection of the position ID of the uninvestigated power distribution substation SS to the current process until all the position IDs of the power distribution substations SS registered in the investigation list are investigated.

The association unit 19b is a processing unit which associates the facility (obtained from the combination of junctions where the investigation is performed and a result of the search) and the attribute information of a facility obtained as a result of the search among the attribute information contained in the facility information 15. As an aspect, the association unit 19b associates the record of the "branch" where the investigation is performed and the attribute information of the "branch" searched from the "span" table 15b or the "unit" table 15a. For example, the association unit 19b registers the attribute information of the "branch" in association with the facility ID or the branch ID of the "branch" used in the search of the "span" table 15b or the "unit" table 15a among the records stored in the current "branch" table 17b. At this time, the association unit 19b searches the position ID corresponding to the facility ID of the "branch" from the "unit" table 15a or the "span" table 15b and then further associates the position ID.

Herein, a processing content of the search unit 19a and the association unit 19b will be specifically described using the respective tables of FIGS. 4 to 8. First, the position ID "SS0001" of which the position type is the power distribution substation "SS" is searched among the position IDs stored in the "location" table 14a illustrated in FIG. 4. Then, the position ID "SS0001" of the power distribution substation SS searched from the "location" table 14a is registered in the investigation list. In this case, since only the position ID "SS0001" of the power distribution substation SS is registered in the investigation list, the position ID "SS0001" is selected. Then, the node ID "SS0001N01" corresponding to the position ID "SS0001" of the power distribution substation SS on which the selection is previously performed is searched among the nodes stored in the node table 16a illustrated in FIG. 7. Subsequently, the record of the node ID "SS0001N01" searched from the node table 15a is registered in the current node table 17a. Furthermore, the node ID "SS0001N01" searched from the node table 16a is registered even in the investigation list. In this case, since only the node ID "SS0001N01" is registered in the investigation list, the node ID "SS0001N01" is selected.

Then, the node $ID_1$ "SS0001N01" is searched among the "branches" stored in the "branch" table 16b illustrated in FIG. 8, and the "branch" of the facility ID "SP0001" having the combination of the node $ID_1$ "SS0001N01" and the node $ID_2$ "PO0001N01" is found. Thereafter, the record of the "branch" of the facility ID "SP0001" searched from the "branch" table 16b is registered in the current "branch" table 17b. Furthermore, the facility ID "SP0001" searched from the "branch" table 16b is registered in the investigation list. In this case, since only the facility ID "SP0001" is registered in the investigation list, the facility ID "SP0001" is selected.

Then, the attribute information "span size 21 m, resistance $R_{H1}$, reactance $X_{B1}$" of the "span" corresponding to the facility ID "SP0001" on which the selection is previously performed is searched from the "span" table 15b illustrated in FIG. 6. Further, herein, the description has been made about a case where the attribute information of the "span" is searched. However, in a case where the facility ID starts with a string other than "SP", the attribute information is not searched from the "span" table 15b, but the attribute information of the "unit" is searched from the "unit" table 15a illustrated in FIG. 5.

From the attribute information "span size 21 m, resistance 220 Ω/m, reactance 150 Ω/m" thus obtained, a resistance value of 4621 (220×21) Ω and a reactance value of 3150 (150×21) Ω are registered in the current "branch" table 17b in association with the record of the "branch" of the facility ID "SP0001" used in searching the "span" table 15b.

Thereafter, the other node ID "PO0001N01" paring with the node ID "SS0001N01" used in the investigation is set as a value in the combination of the node $ID_1$ "SS0001N01" and the node $ID_2$ "PO0001N01". In this way, since the other node ID is not a blank, it is determined whether the "branch" of the subject facility ID "SP0001" is a switch. Then, in the "branch" of the facility ID "SP0001", a value of the open/close division is a blank, and the "branch" is not the switch. Therefore, the record of the other node ID "PO0001N01" is searched from the node table 16a and then the record of the other node ID "PO0001N01" is registered in the current node table 17a of the power distribution system information 17. Furthermore, the other node ID "PO0001N01" is added to the investigation list as an uninvestigated node.

In this way, at the time when the other node ID "PO0001N01" is registered in the investigation list as an uninvestigated node, the node ID other than the node ID "PO0001N01" is not registered. Therefore, the node ID "PO0001N01" is investigated and then the search is kept on.

Further, herein, the case where the other node ID is not a blank has been exemplified, but in a case where the other node ID is a blank, the investigation of the uninvestigated "branch" registered in the investigation list is performed. In addition, when the uninvestigated "branch" is not present, the investigation of the uninvestigated node is performed. Then, when the position of the uninvestigated power distribution substation SS is not present, the investigation is ended. In addition, herein, the case where the "branch" is not a switch has been exemplified, but in a case where the "branch" is a switch, when the switch is not in the close state, the search of the other node ID and the addition of the other node to the investigation list are not performed. This is because in a case where the switch is in the open state, when the search of the other node ID and the addition of the other node to the investigation list are performed, another power distribution system which is not electrically connected is erroneously registered in the current node table 17a or the current "branch" table 17b.

Through the above investigation, it is possible to generate the current node table 17a containing nodes of the power distribution system of which facilities are electrically connected to each other at the time of investigation among the "branches" registered in the node table 16a. Furthermore, through the above investigation, it is possible to generate the current "branch" table 17b in which "branches" electrically connected to each other in the power distribution system and the attribute information corresponding to the "branch" at the time of investigation are searched among the "branches" registered in the "branch" table 16b and then the "branch" and the attribute information are associated. Further, in the following, the power distribution system of which the facilities are electrically connected to each other at the time of investigation may be referred to as a "current system".

The power distribution system information 17 containing the current node table 17a and the current "branch" table 17b thus generated is registered in the storage unit 13. FIG. 9 is a diagram illustrating an example of the current node table 17a. FIG. 10 is a diagram illustrating an example of the current "branch" table 17b. In FIGS. 9 and 10, the current node table 17a and the current "branch" table 17b which are generated by using the respective tables illustrated in FIGS. 4 to 8 are illustrated starting from the node ID "SS0001N01".

As illustrated in FIG. 9, among the records of the current node table 17a, the power consumption as an example of the attribute information) measured by a meter such as a smart meter is registered in the records of the nodes "LL0001N01", "LL0002N01", "LL0003N01", "LL0004N01", "LL0005N01", "LL0006N01", "LL0007N01", and "LL0008N01" which are the junctions between the load facilities of the customers and the facilities of the power distribution system. The power consumption contains "effective power" which is consumed by the load facility and "reactive power" which is not consumed by the load facility. Among them, the reactive power is called delay reactive power. The power consumption (effective) and the power consumption (reactive) are referred in a case where the power of each node is calculated.

As illustrated in FIG. 10, the value of the open/close division registered in the "branch" table 16b is registered in a record in which the facility of the "branch" is a switch among the records of the current "branch" table 17b. For example, since all the open/close divisions are registered with a value of "1" in the switch of the branch IDs "BR0002", "BR0006", and "BR0019", it means that the switches are in the close state and in the energizing state. In FIG. 10, the switch of which the open/close division is "1" has been exemplified, in a case where the open/close division of the switch is "0", it means that the switch is in the open state and not in the energizing state. In addition, a reactance value X and a resistance value R (as an example of the attribute information) are registered in the respective records of the current "branch" table 17b. Among them, in a case where the facility of the "branch" is a "unit" (for example, the switch or the transformer), the reactance value X and the resistance value R registered in the "unit" table 15a are registered as the attribute information without any change. On the other hand, in a case where the facility of the "branch" is a "span", a value obtained by multiplying the value of the span size by the reactance value per unit registered in the "span" table 15 is registered as the reactance value X, and a value obtained by multiplying the value of the span size by the resistance value per unit is registered as the resistance, value R. The reactance value X and the resistance value R of these "unit" and "span" are referred in a case where a voltage at each node is calculated.

Further, herein, the power consumption (effective), the power consumption (reactive), the resistance value, and the reactance value have been exemplified as a parameter used for calculating the voltage, a connection phase item to which the transformer is connected is added in any one of the current node table 17a or the current "branch" table 17b, so that the calculation of the voltage can be accurately performed. For example, in a case where the wires are the single-phase three wires, a first transformer connected to the wire on a pole is referred to as "connection phase 1", a second one is referred to as "connection phase 2", and a third one is referred to as "connection phase 3". Further, in a case where the transformer is connected to the first and second wires of the three wires, a value of "A" can be registered, in a case where the second and third wires are connected to the transformer, the value of "B" can be registered, and in a case where the first and third wires are connected to the transformer, a value of "C" can be registered.

Figure 11:
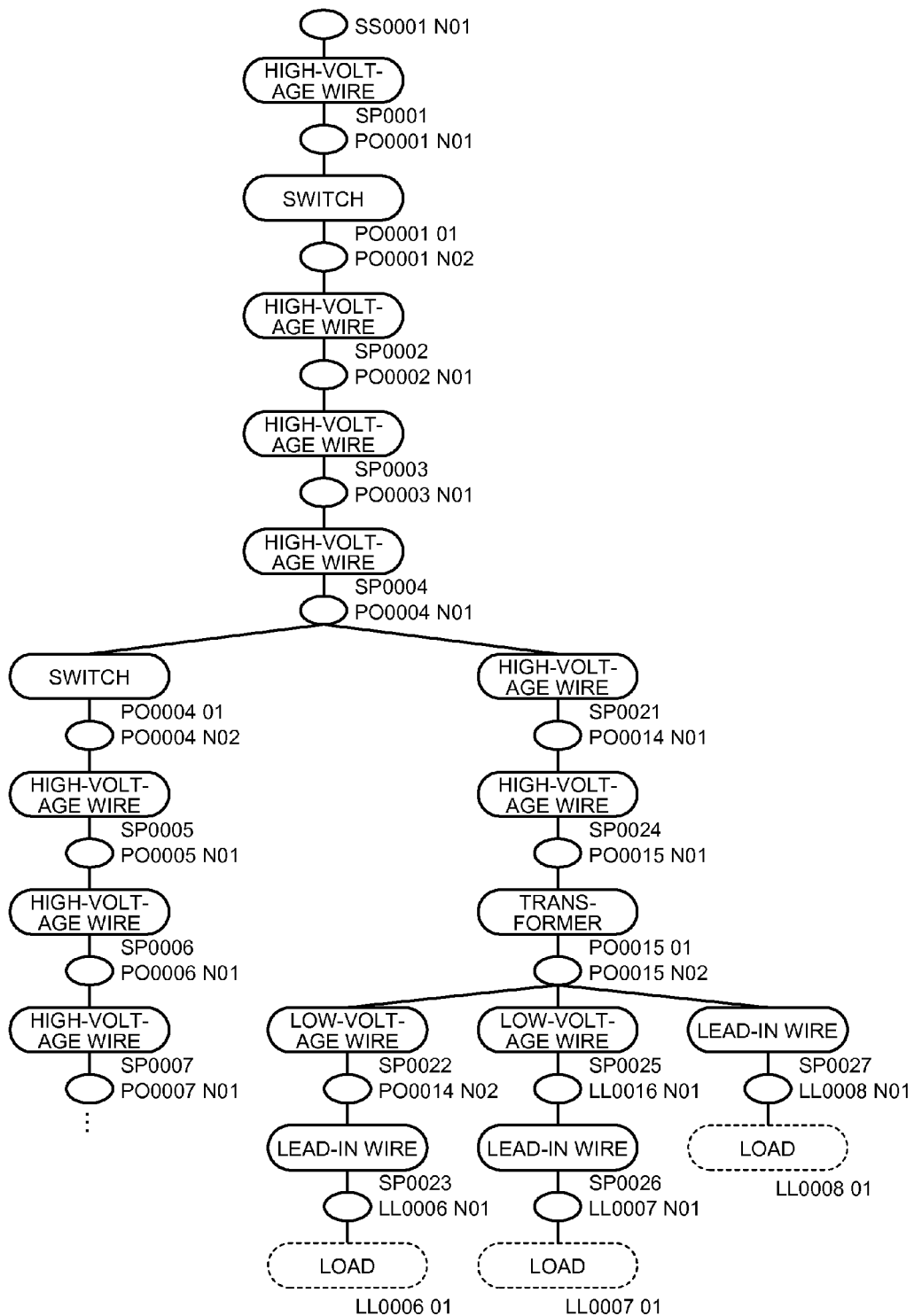
FIG. 11 is a diagram (1) illustrating an example of a graph structure of a power distribution system.
Figure 12:
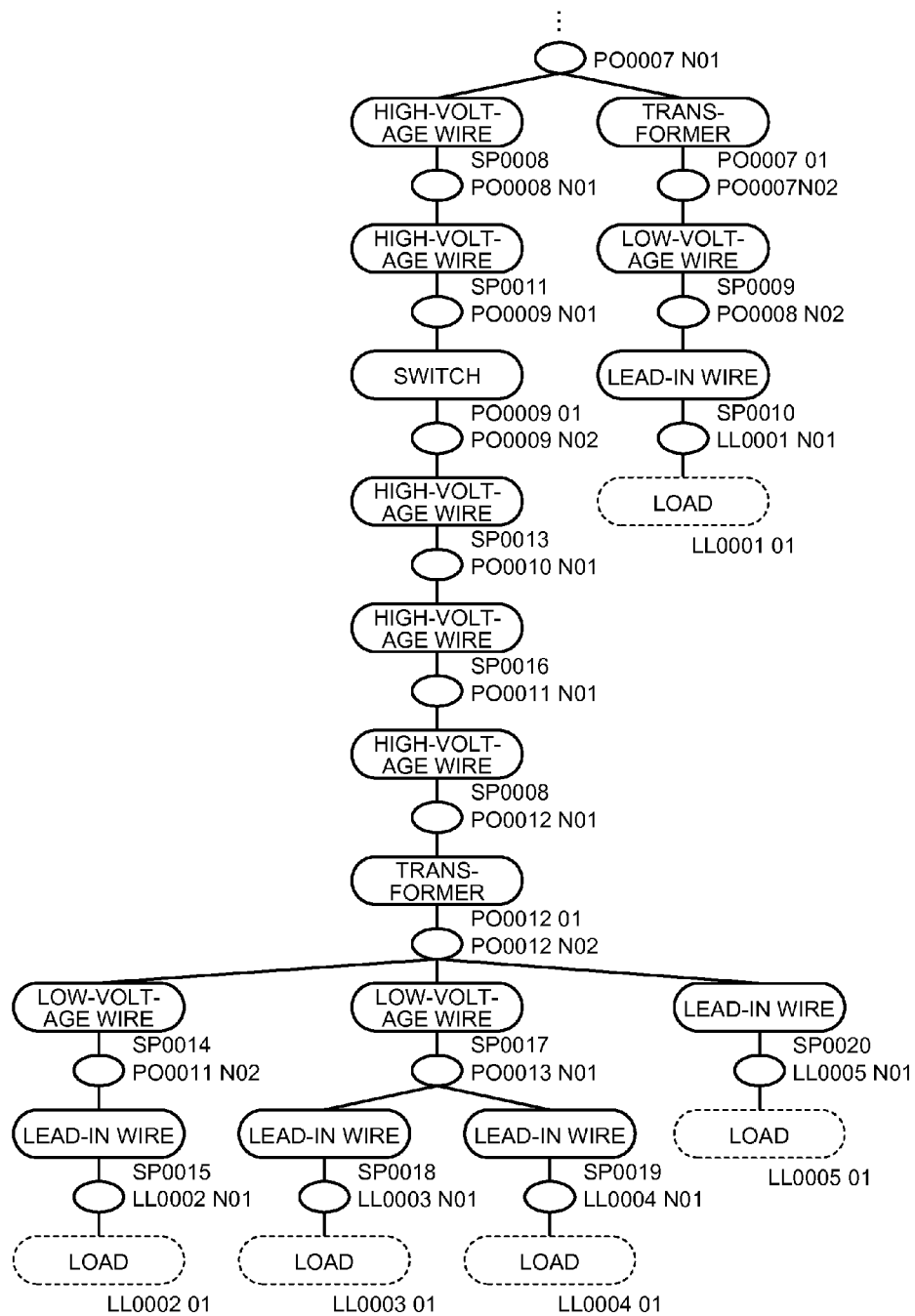
FIG. 12 is a diagram (2) illustrating an example of the graph structure of the power distribution system.

As described above, the current node table 17a illustrated in FIG. 9 and the current "branch" table 17b illustrated in FIG. 10 indicate graphs of the power distribution system illustrated in FIGS. 11 and 12. FIGS. 11 and 12 are diagrams illustrating an example of the graph structure of the current system. The current system illustrated in FIGS. 11 and 12 has a node of a node ID "SS0001N01" which represents a junction between the SS bank and a high-voltage wire of a facility ID "SP0001" as a root (layer 1) of a hierarchical structure. Furthermore, the current system has a route from the root toward eight load facilities of the facility IDs "LL000101", "LL000201", "LL000301", "LL000401", "LL000501", "LL000601", "LL000701", and "LL000801" at the end terminals. In the drawing, it can be seen that the layers from the SS bank to the load facility of the facility ID "LL000801" are the shallowest as 10 layers, and the layers from the SS bank to the load facilities of the facility IDs "LL000201", "LL000301" and "LL000401" are the deepest as 19 layers. In this way, with the power distribution system information 17 thus generated, the electrical connection in the current system can be ascertained by subdividing the system in a unit of facility or a unit of junction between the facilities not in a rough unit such as the high-voltage system or the system.

Returning to the description of FIG. 1, the acquisition unit 19c is a processing unit which acquires the power consumption of the smart meter 50. As an aspect, the acquisition unit 19c acquires the power consumption which is updated from the smart meter 50 connected to the load facility of each customer. Subsequently, the acquisition unit 19c, additionally registers the facility ID of the load facility connected to the smart meter 50, an updated date, a time, and a record associated with the power consumption in a load table 18a of the load information 18. For example, it is assumed a case where the smart meter 50 updates the power consumption at every predetermined time period (for example, 30 minutes). In this case, the record is registered in the load table 18a for each smart meter 50 in a cycle corresponding to a sum of a meter reading interval for notifying the smart meter 50 of the reading result of the power consumption and a transmission delay time between the smart meter 50 and the power distribution management apparatus 10.

Herein, an example of the load information 18 stored in the storage unit 13 will be described. The load information 18 can employ the items such as the load table 18a in which the facility ID, the date, the time, and the power consumption are associated. FIG. 13 is a diagram illustrating an example of the load table 18a. As illustrated in FIG. 13, power consumption U11 and power consumption U12 are uploaded from the smart meter 50 connected to the load facility of the facility ID "LL1" at a time of 14:40:18 and a time of 15:10:19 on a date of Sep. 5, 2012. In addition, after power consumption U20 is uploaded from the smart meter 50 connected to the load facility of the facility ID "LL2" at a time of 14:38:59 on a date Sep. 5, 2012, the uploading is stopped up to at least 15:10:19. Furthermore, the uploading from the respective smart meters 50 connected to the load facilities of the facility IDs "LL3" and "LL4" is also stopped 30 minutes or more after a time 14:40:29 or a time 14:42:33 on a date of Sep. 5, 2012. Further, for the convenience of explanation on the detection of an abnormal item, FIG. 13 illustrates an example of the load facility independent from the example of the facility illustrated in the "unit" table 15a of FIG. 5.

The detection unit 19d is a processing unit which detects an abnormal item in the power distribution system. As an aspect, the detection unit 19d determines whether an energizing state of each node included in the load facility of the customer is a connection state or a blackout state using the load information 18. Then, while targeting a node of which the energizing state is the connection state among the nodes of the load facility of the customer, the detection unit 19d searches a node on a side near the substation (that is, the primary side) from the subject node to detect the node of which the energizing state is the connection state. Furthermore, while targeting a node of which the energizing state is the blackout state among the nodes of the load facility of the customer, the detection unit 19d performs the search from the subject node toward a node on the primary side to detect the node of which the energizing state is the blackout state. Thereafter, the detection unit 19d detects a "branch" having the node of which the energizing state is the connection state and the node of which the energizing state is the blackout state as a "branch" where an abnormality such as a failure or an accident occurs. Further, in the following, the node of the load facility of the customer may be referred to as a "terminal node", the node of which the energizing state is the connection state as a "connection node", the node of which the energizing state is the blackout state as a "blackout node", and the "branch" where an abnormality occurs as an "abnormal "branch"".

The determination on the energizing state of the terminal node will be described. For example, the detection unit 19d activates a process at every time when (the meter reading interval of the smart meter 50+the transmission delay time between the smart meter 50 and the power distribution management apparatus 10) elapses after the detection of the abnormal "branch" is performed at the last time. First, the detection unit 19d sets all the nodes registered in the current node table 17a to an "undefined" energizing state. Then, the detection unit 19d searches a current "branch" having the facility ID of the load facility connected to the smart meter 50 from the current "branch" table 17b. Subsequently, the detection unit 19d registers the current "branch" searched from the current "branch" table 17b in the investigation list.

Thereafter, the detection unit 19d selects one current "branch" from the investigation list. Subsequently, the detection unit 19d searches a record corresponding to the facility ID of the current "branch" on which the selection is performed at the last time from the load table 18a. Then, in a case where the records corresponding to the facility ID of the current "branch" are searched, the detection unit 19d determines whether the latest record among the searched records is acquired within a predetermined time period (for example, the meter reading interval "30 minutes"+the transmission delay time "α") from the current time. For example, the detection unit 19d determines whether a time obtained by adding the predetermined time period (for example, the meter reading interval+the transmission delay time) to the time of the latest record falls within the current time. The "current time" herein indicates a time at the date when the process is performed.

At this time, in a case where the latest record is acquired within the predetermined time period from the current time, the detection unit 19d sets the energizing state of the node (that is, the terminal node) on the primary side of the current "branch" to "Connection". On the other hand, in a case where the record is not searched from the load table 18a, or in a case where the record is searched but the date and the time of the latest record do not fall within the predetermined time period from the current time, the detection unit 19d sets the energizing state of the terminal node to "Blackout". Thereafter, the detection unit 19d repeatedly performs the determination on the energizing state of the terminal node until the uninvestigated "branch" disappears from the investigation list.

Herein, a specific example of the determination on the energizing state of the terminal node will be described using FIGS. 14 to 17. FIG. 14 is a diagram illustrating an example of the current node table 17a. FIG. 15 is a diagram illustrating an example of the current "branch" table 17b. Further, the tables illustrated in FIGS. 14 and 15 are substantially similar to the node table 16a illustrated in FIG. 7 and the "branch" table 16b illustrated in FIG. 8, while items used for the detection of the abnormal "branch" are added and items not used for the detection of the abnormal "branch" are omitted. For example, the item of the energizing state used for the detection of the abnormal "branch" is added in the current node table 17a illustrated in FIG. 14 compared to the node table 16a illustrated in FIG. 7, and even though the position ID is not denoted, also the position ID is normally considered to be registered while the notation is omitted. In addition, while the open/close division not used for the detection of the abnormal "branch" is not denoted in the current "branch" table 17b illustrated in FIG. 15, also the open/close division is normally considered to be registered while the notation is omitted. Further, for the convenience of explanation on the detection of the abnormal "branch", FIGS. 14 and 15 illustrate an example of the node and the "branch" of the power distribution system different from the graph structure of the power distribution system illustrated in FIGS. 11 and 12.

Figure 16:
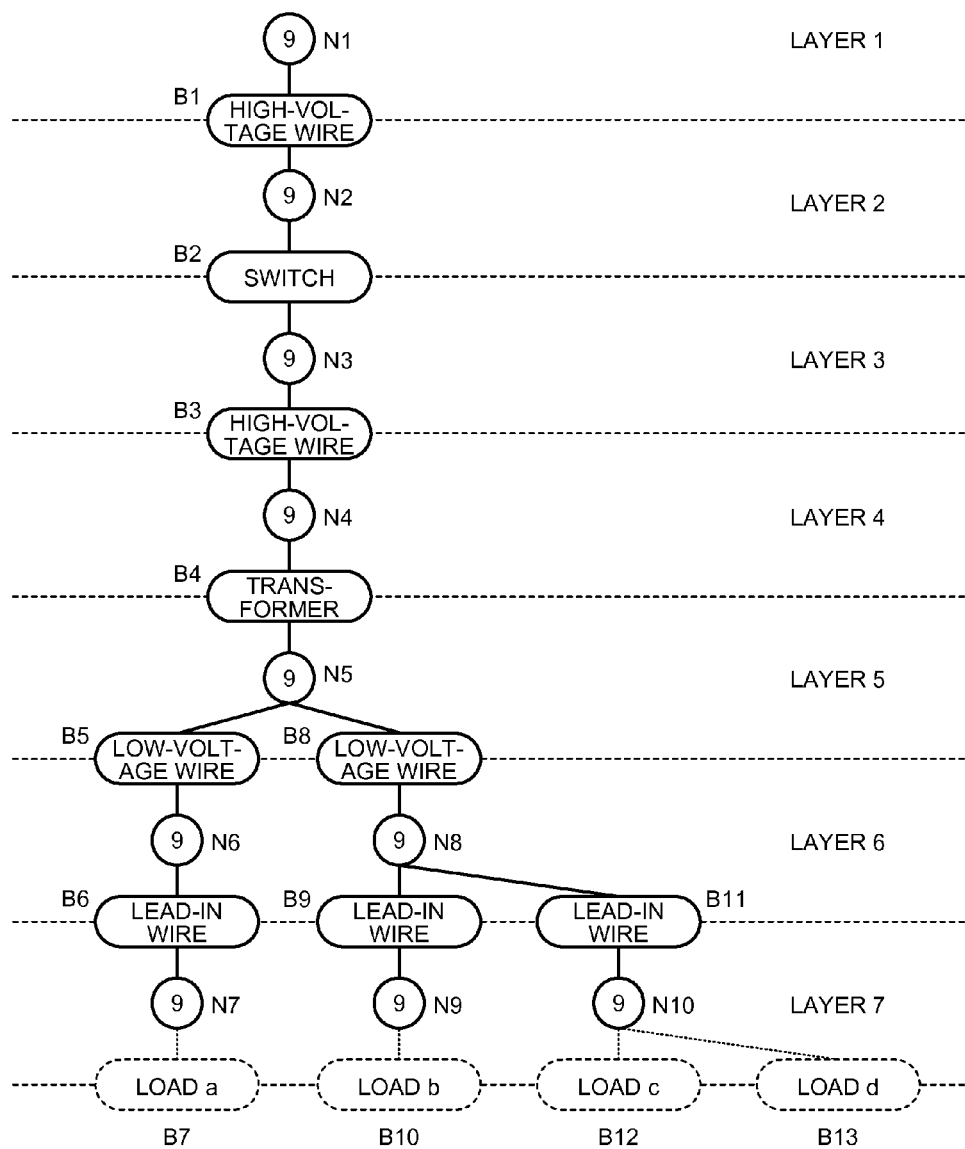
FIG. 16 is a diagram illustrating an example of the graph structure of the current system.
Figure 17:
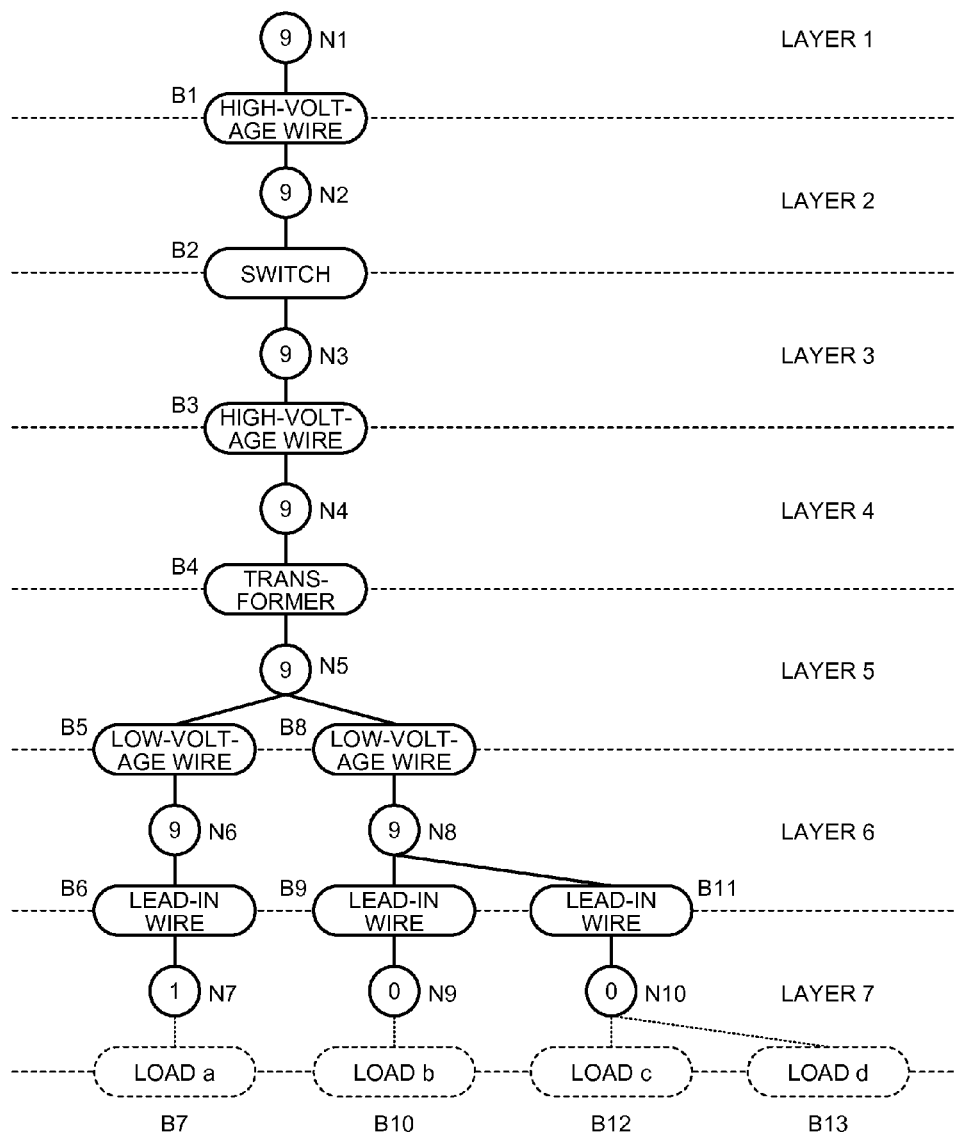
FIG. 17 is a diagram illustrating an example of the graph structure of the current system.

FIGS. 16 and 17 are diagrams illustrating an example of the graph structure of the current system in FIGS. 16 and 17, there is denoted transition in setting of the energizing state in a case where the energizing state of the terminal node is determined using the current node illustrated in FIG. 14 and the current "branch" illustrated in FIG. 15. Among them, in FIG. 16, there is denoted a setting situation of the energizing state at a time point when the determination on the energizing state of the terminal node starts and all the current nodes are set to the "undefined" energizing state, and in FIG. 17, there is denoted a setting situation of the energizing state at a time point when the determination result is set to the energizing state of the terminal node. In addition, in FIGS. 16 and 17, the energizing state of the current node is denoted in each current node. In the following description, when the value of the energizing state set in the node is "1", it indicates "Connection", when the value is "0", it indicates "Blackout", and when the value is "9", it indicates "Undefined".

For example, the process is activated in a case (the meter reading interval after the detection of the abnormal "branch" at the last time+the transmission delay time elapses, and as illustrated in FIG. 16, the energizing states of all the current nodes registered in the current node table 17a illustrated in FIG. 14 are set to "9 (Undefined)". Then, the current "branch" having the facility ID of the load facility connected to the smart meter 50 is searched from the current "branch" table 17b illustrated in FIG. 15. Referring to the example of the current "branch" illustrated in FIG. 15, there are searched four current "branches" (that is, the branch IDs "B7", "B10", "B12", and "B13") of the facility IDs "LL1", "LL2", "LL3", and "LL4" where the node IDs on the secondary side are not set. Four "branches" of the facility IDs "LL1", "LL2", "LL3", and "LL4" thus searched are registered in the investigation list.

Thereafter, one current "branch" is selected from the investigation list. At this time, a case where the facility ID "LL1" is selected will be assumed. For example, when the current time is 15:20:00, there is a record having the facility ID "LL1" in the load table 18a illustrated in FIG. 13, and the time "15:10:19" of the latest record falls within a predetermined time period (for example, within 30 minutes 1 minute) from the current time "15:20:00". Therefore, the node (that is, the energizing state of the terminal node "N7") of the "branch" of the facility ID "LL1" on the primary side is set to "1". On the other hand, in a case where the current "branches" of the facility IDs "LL2", "LL3", and "LL4" are selected, the time falls within the predetermined time period from the moment, so that the nodes (that is, the energizing states of the terminal nodes "N9" and "N10") of these "branches" on the primary side are set to "0". In this way, the energizing states of the terminal nodes are set to the state illustrated in FIG. 17.

Next, the determination on the connection node will be described. For example, when the determination on the energizing state of the terminal node is ended, the detection unit 19d searches the terminal node of which the energizing state is the connection state among the current nodes registered in the current node table 17a. Thereafter, the detection unit 19d registers the current node searched from the current node table 17a in the investigation list. Subsequently, the detection unit 19d selects one current node from the investigation list. Subsequently, the detection unit 19d searches the current "branch" having the current node on the secondary side previously selected among the current "branches" registered in the current "branch" table 17b.

Then, in a case were the current "branch" is searched from the current "branch" table 17b, the detection unit 19d searches the current node of the current "branch" on the primary side. At this time, in a case where the energizing state of the current node on the primary side is set to "Undefined", the detection unit 19d sets the energizing state of the current node on the primary side to "Connection", and registers the current node on the primary side in the investigation list. Thereafter, until the uninvestigated current node disappears from the investigation list, the detection unit 19d repeatedly performs a process of investigating the connection node from the terminal node to the uppermost node of the SS bank.

Figure 18:
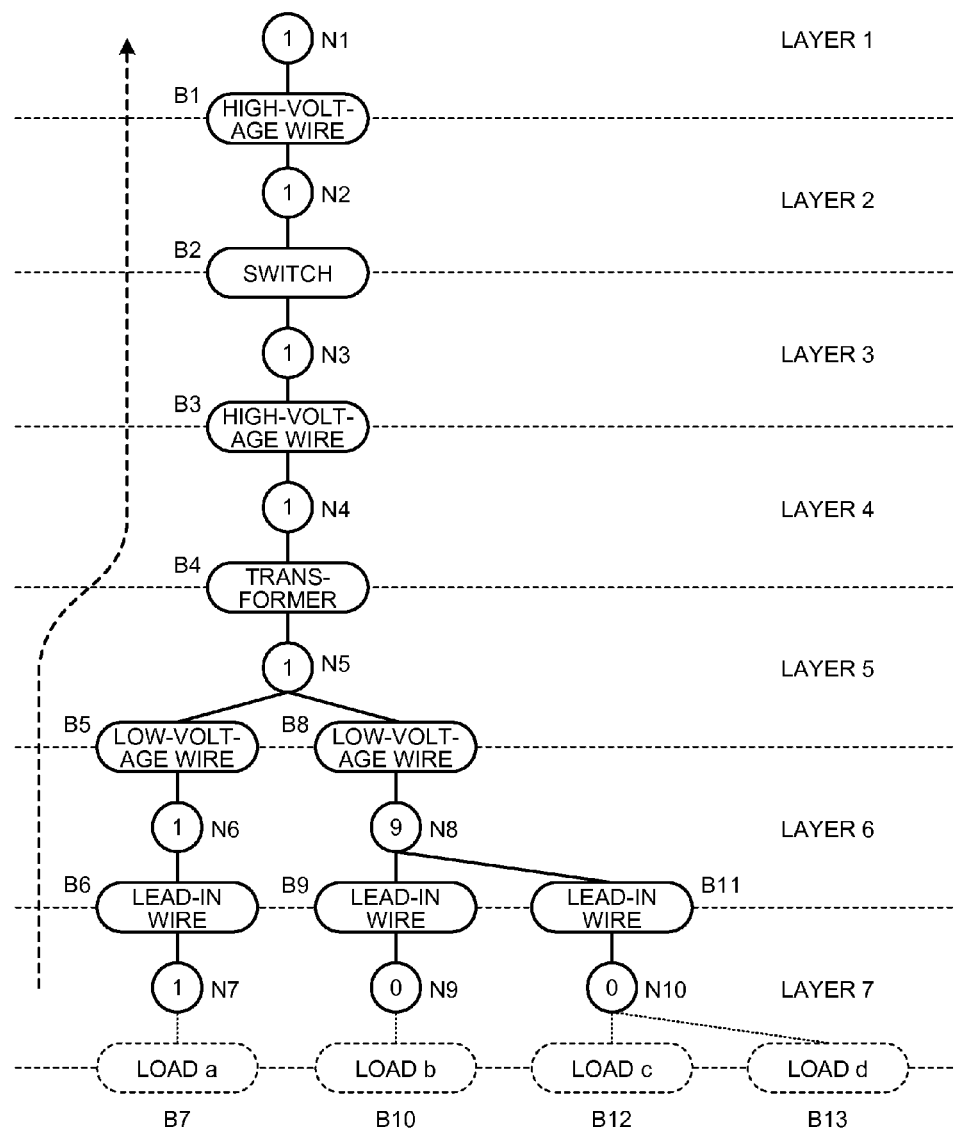
FIG. 18 is a diagram illustrating an example of the graph structure of the current system.

Herein, a specific example of the determination on the connection node will be described using FIGS. 17 and 18. FIG. 18 is a diagram illustrating an example of the graph structure of the current system. In FIG. 18, a setting situation of the energizing state at the time when the determination on the connection node is ended is illustrated. For example, after the determination on the energizing state of the terminal node is ended, only the terminal node (that is, the terminal node having the node ID "N7" illustrated in FIG. 17) of which the energizing state of the terminal node is set to "Connection" is investigated and then registered in the investigation list. In this case, since only the terminal node having the node ID "N7" is registered in the investigation list, the terminal node having the node ID "N7" is selected. Then, the current "branch" having the current node "N7" on the secondary side (the "span" having the facility ID "SP4" in the example illustrated in FIG. 15) is searched.

Then, the current node "N6" on the primary side of the current "branch" having the facility ID "SR4" is searched. At this time, since the energizing state of the current node "N6" on the primary side is set to "Undefined" as illustrated in FIG. 17, the energizing state of the current node "N6" on the primary side is set to "Connection", and the current node "N6" on the primary side is additionally registered in the investigation list. Thereafter, as a result of the process performed in such a flow, the current node "N6" is selected, the energizing state of the current node "N6" is set to "Connection", and the current node "N5" is additionally registered in the investigation list. Afterward, the investigation of the current node is performed in an order of "N5", "N4", "N3", "N2", and "N1" and thus the energizing states of the respective current nodes are set to "Connection". Then, when the investigation of the uppermost current node "N1" is ended, the uninvestigated current node disappears and the determination on the connection node is ended. As a result, the energizing states of the current nodes are updated to be the state illustrated in FIG. 18.

Next, the determination on the blackout node will be described. For example, when the determination on the connection node is ended, the detection unit 19d searches a terminal node of which the energizing state is set to "Blackout" among the current nodes registered in the current node table 17a. Thereafter, the detection unit 19d registers the current node (that is, the terminal node) searched from the current node table 17a in the investigation list. Subsequently, the detection unit 19d selects one current node from the investigation list. Subsequently, the detection unit 19d searches the current "branch" having the current node (on which the selection is previously performed) on the secondary side among the current "branches" registered in the current "branch" table 17b.

Then, in a case where the current "branch" is searched from the current "branch" table 17b, the detection unit 19d searches the current node on the primary side of the current "branch" from the current node table 17a. At this time, in a case where the energizing state of the current node on the primary side is set to "Undefined", the detection unit 19d searches the current "branch" which has the current node having the "Undefined" energizing state on the primary side from among the current "branch" table 17b. Thereafter, the detection unit 19d registers the current "branch" searched from the current "branch" table 17b in the investigation list. Further, in a case where the energizing state of the current node on the primary is not set to "Undefined", the energizing state of the current node on the primary side is set to be "Connection" or "Blackout" which is already known. In this case, the investigation from the terminal node is stopped.

Subsequently, the detection unit 19d selects one current "branch" from the investigation list. Then, the detection unit 19d searches the current node on the secondary side of the current "branch" on which the selection is previously performed from the current node table 17a. Then, the detection unit 19d determines whether the energizing state of the current node on the secondary side searched from the current node table 17a is a state other than "Connection". Thereafter, in a case where the energizing state of the current node on the secondary side is a state other than "Connection", the detection unit 19d selects one uninvestigated current "branch" from the investigation list, and repeatedly investigates the current nodes on the secondary side of all the current "branches" having the current node of which the energizing state is set to "Undefined" on the primary side.

Thereafter, in a case where the current node on the primary side is set to "Undefined" and the energizing states of all the current nodes on the secondary side are set to a state other than "Connection", the detection unit 19d sets the "Undefined" energizing state of the current node to the "Blackout" and additionally registers the current node in the investigation list. Then, the detection unit 19d repeatedly performs a process of investigating the blackout node from the terminal node to the uppermost node of the SS bank until the uninvestigated current node disappears from the investigation list.

Figure 19:
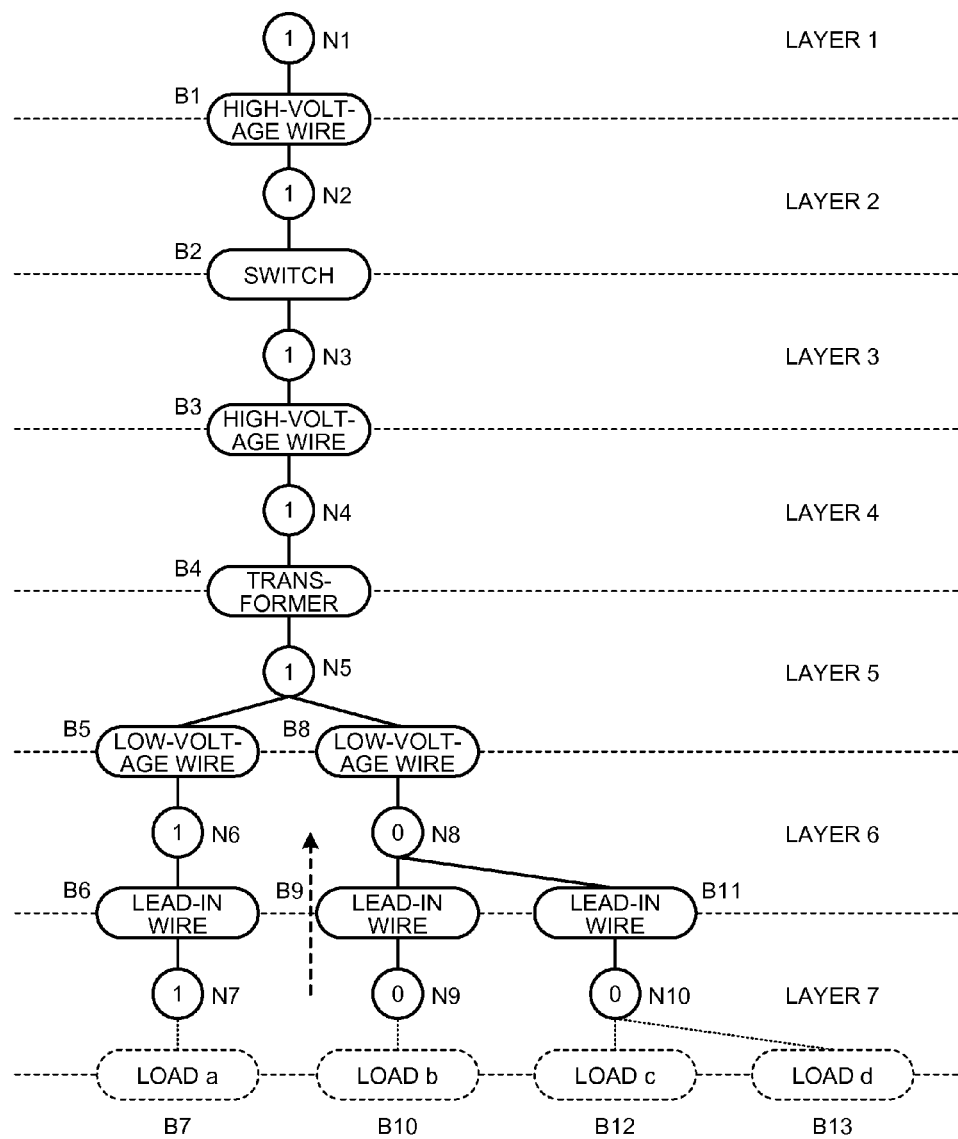
FIG. 19 is a diagram illustrating an example of the graph structure of the current system.

Herein, a specific example of the determination on the blackout node will be described using FIGS. 18 and 19. FIG. 19 is a diagram illustrating an example of the graph structure of the current system. In FIG. 19, a setting situation of the energizing state at the time when the determination on the blackout node is ended is illustrated. For example, after the determination on the connection node is ended, the terminal node (that is, the terminal nodes having the nodes ID "N9" and "N10" illustrated in FIG. 18) of which the energizing state is set to "Blackout" is searched and registered in the investigation list. Herein, as an example, a case where the terminal node having the node ID "N9" is selected will be considered. Then, the current "branch" "B9" having the current node "N9" on the secondary side is searched.

Then, the current node "N8" of the current "branch" "B9" on the primary side is searched. Since the energizing state of the current node "N8" is set to "Undefined", the current "branch" "B11" having the current node "N8" on the primary side is searched. The current node "N10" of which the energizing state is set to "Blackout" is connected to the current "branch" "B11". In other words, below the current node "N8", there is no current node of which the energizing state is a state other than "Blackout". In this case, the energizing state of the current node "N8" of which the energizing state is set to "Undefined" is updated to be "Blackout". As a result, the energizing state of the current node is updated to be the state illustrated in FIG. 19.

Next, the detection of the abnormal "branch" will be described. For example, when the determination on the blackout node is ended, the detection unit 19d searches the current node which has no primary side among the current nodes registered in the current node table 17a. Thereafter, the detection unit 19d registers the current node which is the uppermost node searched from the current node table 17a in the investigation list. Subsequently, the detection unit 19d selects one current node from the investigation list.

Then, the detection unit 19d searches the current "branch" having the current node on the primary side where the selection is previously performed from the current "branch" table 17b. Thereafter, the detection unit 19d registers the current "branch" searched from the current "branch" table 17b in the investigation list. Subsequently, the detection unit 19d selects one current "branch" from the investigation list. Thereafter, the detection unit 19d further searches the current node on the secondary side of the current "branch" selected from the investigation list. Thereafter, the detection unit 19d determines whether the energizing state of the current node on the primary side of the current "branch" selected from the investigation list is "Connection", and the energizing state of the current node on the secondary side is "Blackout".

Herein, in a case where the energizing state of the current node on the primary side of the current "branch" is "Connection" and the energizing state of the current node on the secondary side is "Blackout", it is determined that the current "branch" is a "branch" having the connection node and the blackout node, and the current "branch" is disconnected. In this case, the detection unit 19d detects the current "branch" as an "abnormal "branch"".

On the other hand, even when the energizing state of the current node on the primary side of the current "branch" is "Connection", in a case where the energizing state on the secondary side of the current node is also "Connection", it can be seen that the current "branch" is not disconnected. In this case, the detection unit 19d additionally registers the current node on the secondary side of the current "branch" in the investigation list. Thereafter, until the uninvestigated current "branch" disappears from the investigation list, the detection unit 19d repeatedly determines whether there is the abnormal "branch" having the connection node and the blackout node and additionally registers the current node on the secondary side in the investigation list. Thereafter, when the uninvestigated current "branch" disappears from the investigation list, the detection unit 19d repeatedly selects the current node and determines whether there is the abnormal "branch" having the connection node and the blackout node until the uninvestigated current node disappears from the investigation list. Further, in a case where no abnormal "branch" having the connection node and the blackout node is detected, it can be seen that there is no abnormality in the facility of the electric power provider.

Herein, a specific example of detecting the abnormal "branch" will be described using FIG. 19. For example, after the determination on the blackout node is ended, the current node "N1" having no primary side is searched among the current nodes registered in the current node table 17a and the current node "N1" is registered in the investigation list. Subsequently, when the current node "N1" is selected from the investigation list, the current "branch" "B1" having the current node "N1" on the primary side is searched. Subsequently, the current node "N2" having the current "branch" "B1" on the secondary side is further searched.

At this time, since the energizing state of the current node "N1" on the primary side and the energizing state of the current node "N2" on the secondary side both are "Connection" in the current "branch" "B1", it can be seen that the current "branch" "B1" is not disconnected. In this case, after the current node "N2" on the secondary side of the current "branch" is additionally registered in the investigation list, the detection unit 19d starts the investigation on the current node "N2". Thereafter, the investigation is performed in an order of the current nodes "N2", "N3", and "N4", and thus it can be seen that the current "branches" "B2", "B3" and "B4" are not disconnected. Then, in a case where the investigation on the current node "N2" is performed, two current "branches" "B5" and "B8" are searched.

Among them, in the current "branch" "B5", since the energizing state of the current node "N5" on the primary side and the energizing state of the current node "N6" on the secondary side both are "Connection", it can be seen that the connection is not released. On the other hand, in the current "branch" "B8", since the energizing state of the current node "N5" on the primary side is set to "1" and the energizing state of the current node "N8" on the secondary side is set to "0", it is determined that the current "branch" "B8" is disconnected. In this case, the current "branch" "B8" illustrated in FIG. 19 is detected as an abnormal "branch".

The output unit 19e is a processing unit which performs output control to the client terminal 30. As an aspect, the output unit 19e generates the display data of the graph structure of the current system using the current node table 17a and the current "branch" table 17b contained in the power distribution system information 17, and transmits the display data to the client terminal 30. For example, the output unit 19e selects an arbitrary facility ID designated by a predetermined facility ID (for example, the facility ID of the power distribution substation SS or an arbitrary facility ID designated from the client terminal 30) among the facility IDs contained in the current "branch" table 17b stored in the storage unit 13. Then, the output unit 19e sets a node ID closest to the power distribution substation SS among the combinations of the node IDs associated with the previously-selected facility IDs to a root of a hierarchical structure. Subsequently, the output unit 19e assigns a low-level layer to the node as the number of nodes are increased from the root toward the facility ID of the load facility at the end terminal, and generates display data of a graph structure of the current system in which the facilities are arranged between the respective nodes from the root to the end terminal. Further, the display data herein has been exemplified to be displayed in the client terminal 30, but it may be displayed in a display unit provided in the power distribution management apparatus 10.

As another aspect, in a case where the abnormal "branch" is detected by the detection unit 19d, the output unit 19e may generate display data which prompts a warning of the abnormal "branch" in the graph structure of the current system. For example, the output unit 19e may generate display data which makes the portion of the subject abnormal "branch" distinguished from a display representation of the other "branches". In the example of FIG. 19, the output unit 19e may generate the display data which makes the current "branch" "B8" distinguished from colors or filling patterns of the other "branches" in the graph structure of the current system.

In this way, the related art described above has a limitation in that the range where an abnormality occurs is displayed in a unit of switch section. However, in the present embodiment, it is possible to display the current "branch" "B8" which is a facility having an abnormality. Therefore, it is possible for an authorized person of the electric power provider to ascertain an abnormal item which causes the blackout among the power distribution system. Furthermore, it is possible to ascertain whether the abnormal item is an abnormality occurring in the electric power provider or an abnormality occurring in the customer. In other words, in the related art described above, in a case where a civil complaint about the blackout is received from a customer, the electric power provider or the customer go to the spot to investigate whether the cause is due to the abnormality of the facility of the electric power provider or the facility of the customer (for example, the cause of turning off a breaker of a distribution board). On the other hand, in the present embodiment, the energizing states of the respective nodes included in the graph structure of the current system illustrated in FIG. 19 are displayed. Therefore, in a case where the energizing state of the node connected to the load facility of the customer is set to "1", it can be ascertained that the facility of the customer has a strong possibility to cause the abnormality (for example, the turned-off breaker of the distribution board is suspected as the cause of the blackout). On the other hand, in a case where the energizing state of the node connected to the load facility of the customer is set to "0", it is possible to ascertain that the facility (for example, a facility of the low-voltage system such as the lead-in wire, the low-voltage wirer, and the transformer, or a facility of the high-voltage system) of the electric power provider is abnormal.

As still another aspect, the output unit 19e may set the abnormal "branch" and the "branches" on a side near the load facility from the abnormal "branch" as an abnormal influence range (that is, a blackout range), and generate the display data to be distinguished from the display representation of the other "branches" in the blackout range. For example, the output unit 19e may generate the display data which makes the abnormal "branch" "B8" and the branches "B9" to "B13" on a side near the load facility therefrom in the graph structure of the current system illustrated in FIG. 19 distinguished from colors or filling patterns of the other "branches". At this time, the output unit 19e may distinguish the display mode even between the abnormal "branch" and the "branches" in the blackout range. With this configuration, not only the abnormal item but also the range where the blackout occurs due to the abnormal item can be easily ascertained.

Figure 20:
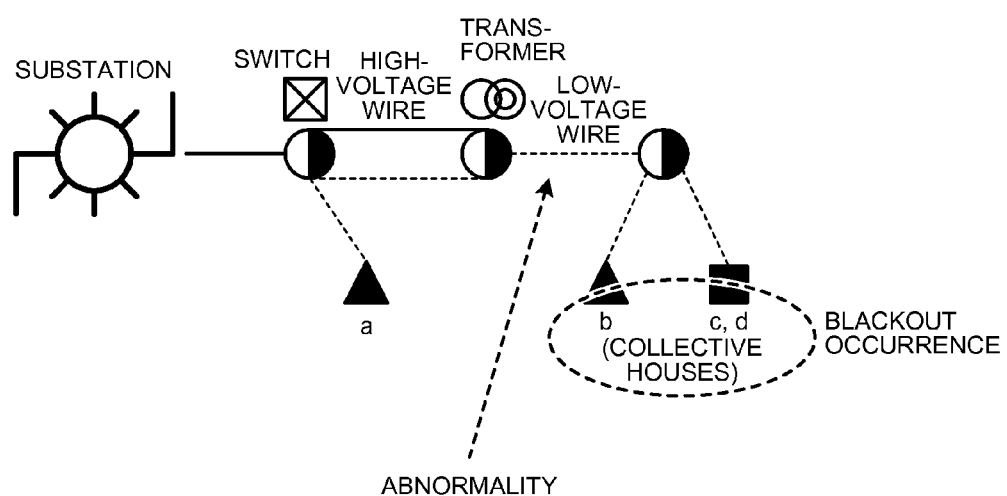
FIG. 20 is a diagram illustrating an example of display data.

As another aspect, the output unit 19e may display the respective "branches" included in the current system with symbols. FIG. 20 is a diagram illustrating an example of the display data. FIG. 20 illustrates a display example in which the current system illustrated in FIG. 19 is expressed with the symbols. As illustrated in FIG. 20, in the display data, the electric power substation, the high-voltage wire, the switch, the transformer, the low-voltage wire, and the load facility are expressed by the symbols. Among them, the color of the low-voltage wire detected as the abnormal "branch" is set to a color different from the other "branches". Through this display, it is possible to ascertain the abnormal item and to intuitively identify the respective "branches" included in the current system.

As still another aspect, the output unit 19e may generate the display data in which the facilities such as the "unit" and the "span" are arranged on a map using the position information of the respective "branches" included in the graph structure of the current system. For example, in a case where the facility contained in the current "branch" table 17b is a "unit", the output unit 19e acquires the position of the facility of the subject "unit" with reference to the position information 14 and the facility information 15. On the other hand, in a case where the facility contained in the current "branch" table 17b is a "span", the output unit 19e acquires the positions of both ends of the subject "span". Thereafter, using the position of the "unit" and the positions of both ends of the "span", the output unit 19e may output the display data in which the "unit" and the "span" are arranged on the map. Furthermore, the output unit 19e may generate the display data in which the abnormal "branch" and the blackout range are distinguished from the other "branches" among the "branches" of the current system arranged on the map.

Figure 21:
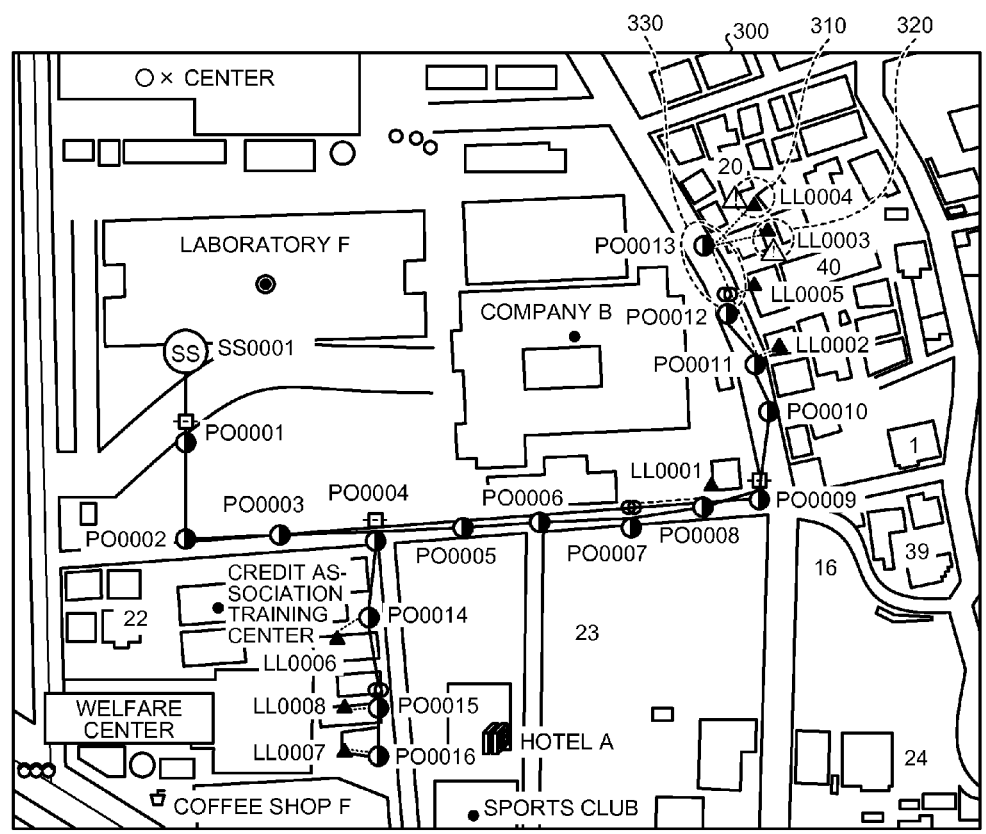
FIG. 21 is a diagram illustrating an example of the display data.

FIG. 21 is a diagram illustrating an example of the display data. FIG. 21 illustrates a case where the respective "branches" included in the current system illustrated in FIGS. 11 and 12 are displayed on the map, assuming a case where the abnormal item is a low-voltage wire 330 of the facility ID "SP0017" and the blackout range is two load facilities 310 and 320 of the facility IDs "LL000301" and "LL000401". In display data 300 illustrated in FIG. 21, since the display positions of the "unit" and the "span" correspond to the actual positions, it is possible to realize the display through which the maintenance is easily planned on the abnormal item (the low-voltage wire 330 of the "span" "SP0017"). In addition, since geographical elements (for example, an infrastructure such as roads and railways, and land marks besides the facilities of the power distribution system) on the map can be compared with the eye, it is possible to realized a display useful for the positioning or the field investigation of the load facilities 310 and 320 of "LL000301" and "LL000401" included in the blackout range.

Further, the controller 19 may employ various integrated circuits or electronic circuits. In addition, some of the functional units of the controller 19 may be configured by other integrated circuits or electronic circuits. For example, as the integrated circuit, an ASIC (Application Specific Integrated Circuit) may be used. In addition, as the electronic circuit, a CPU (Central Processing Unit) or an MPU (Micro Processing Unit) may be used.

Flow of Processes

Next, a flow of processes performed by the power distribution management apparatus according to the embodiment will be described. Further, herein, after (1) a power distribution management process performed by the power distribution management apparatus 10 is described, the description will be made in an order of (2) a determination process of the terminal node, (3) a determination process of the connection node, (4) a determination process of the blackout node, and (5) a detection process of the abnormal "branch".

(1) Power Distribution Management Process

Figure 22:
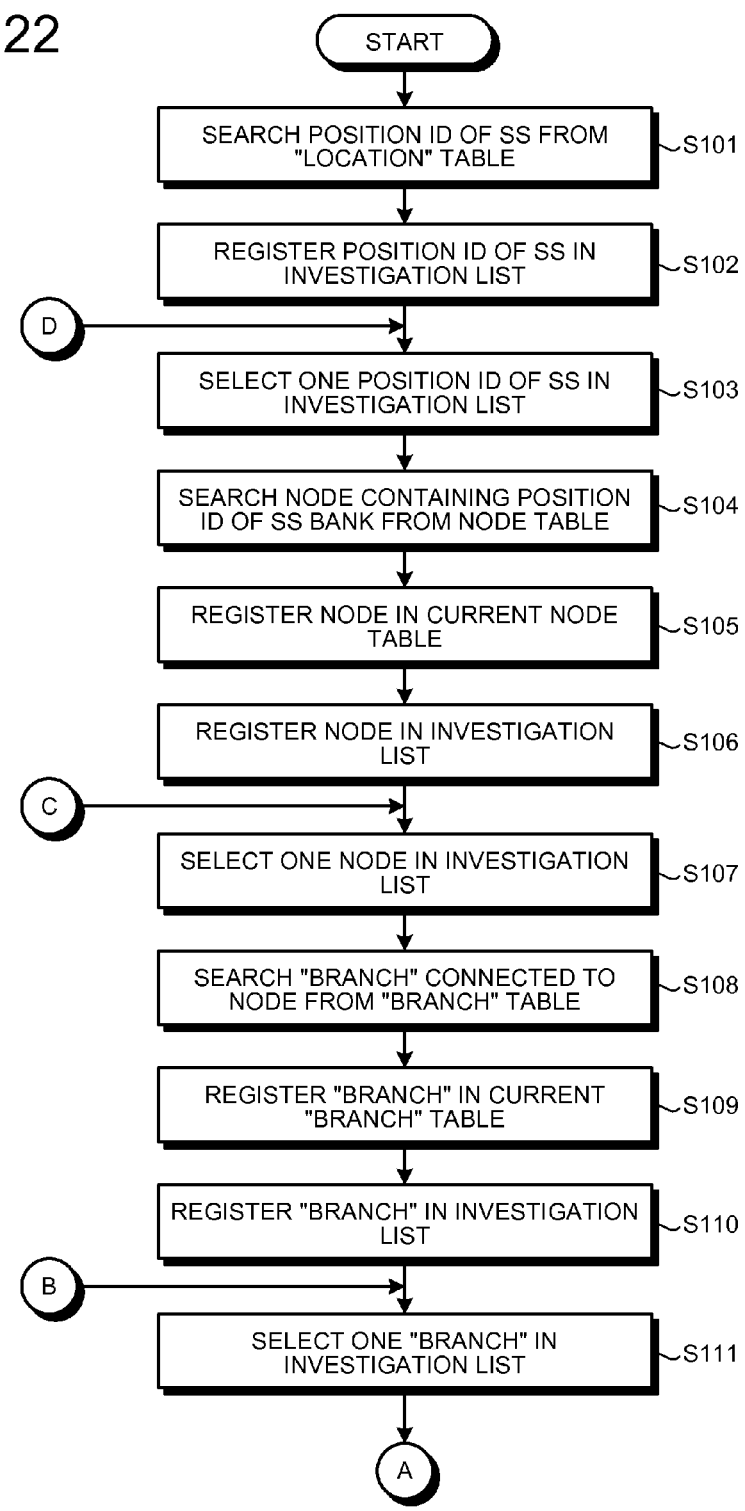
FIG. 22 is a flowchart (1) illustrating a power distribution management process according to a first embodiment.
Figure 23:
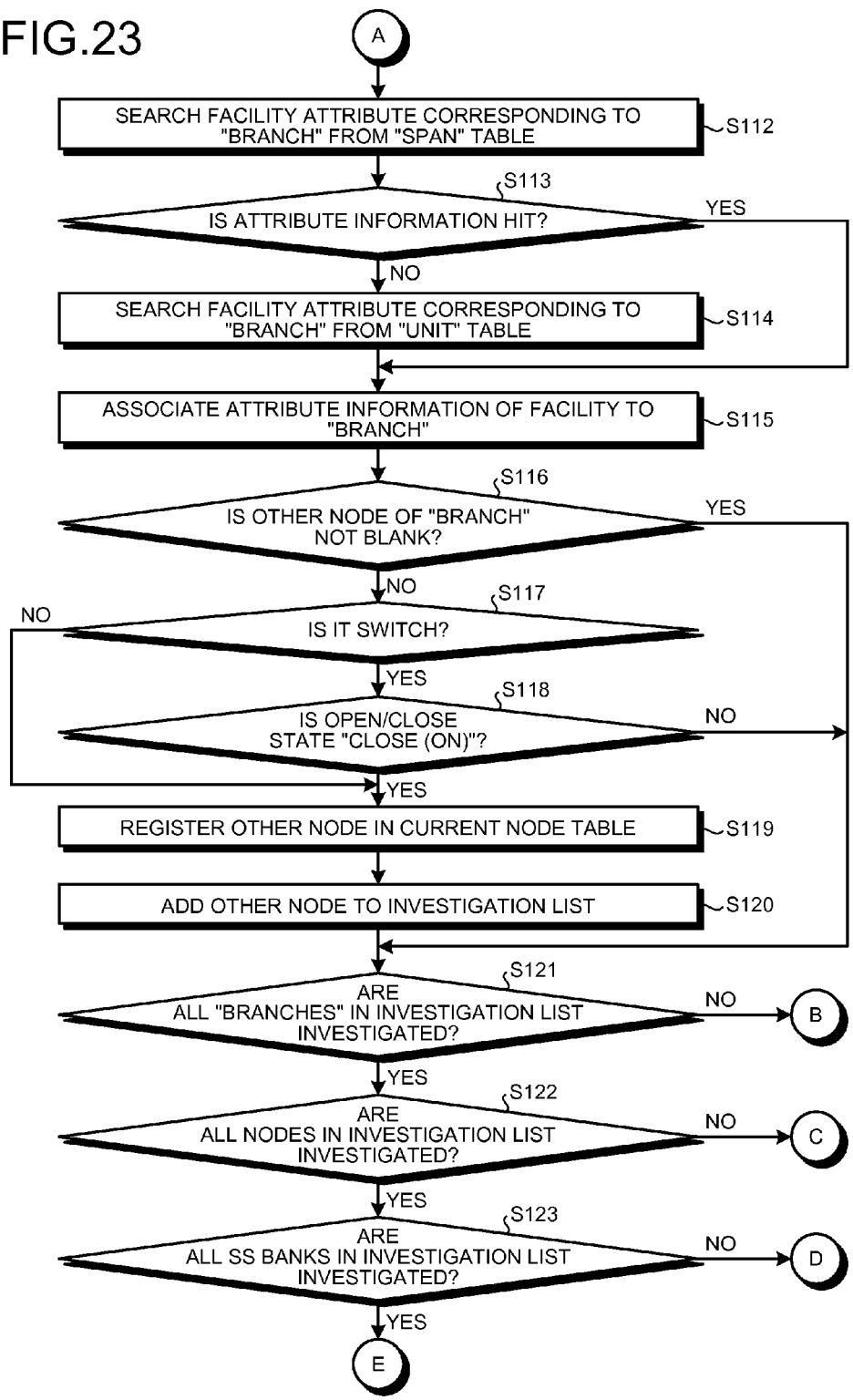
FIG. 23 is a flowchart (2) illustrating the power distribution management process according to the first embodiment.
Figure 24:
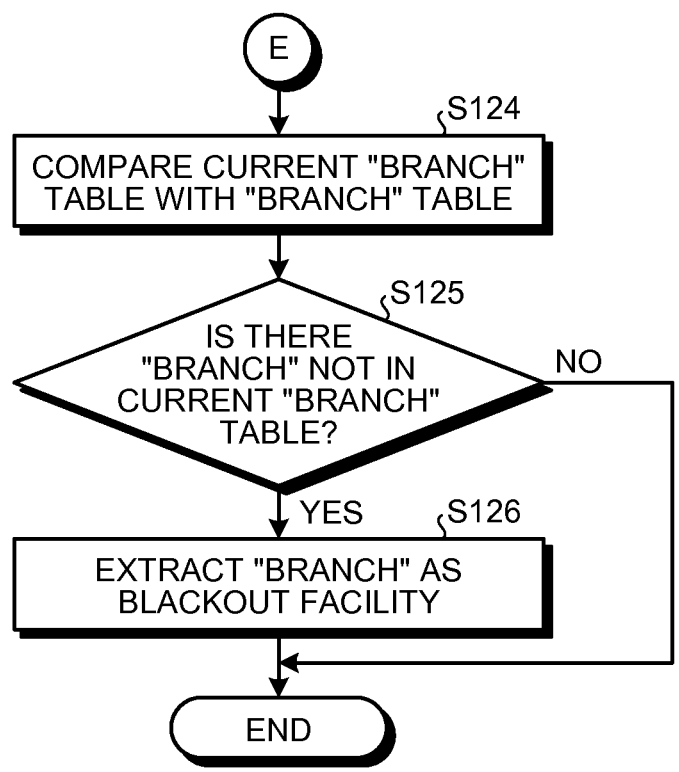
FIG. 24 is a flowchart (3) illustrating the power distribution management process according to the first embodiment.

FIGS. 22 to 24 are flowcharts illustrating a power distribution management process according to the first embodiment. The power distribution management process starts in a case where the browse request of the power distribution system information is received through the client terminal 30, or in a case where a certain time period elapses after the last process.

As illustrated in FIG. 22, the search unit 19a searches the position ID of which the position type is the power distribution substation "SS" among the position IDs stored in the "location" table 14a (Step S101). Then, the search unit 19a registers the position ID of the power distribution substation SS searched from the "location" table 14a to the investigation list (Step S102).

Subsequently, the search unit 19a selects one position ID of the power distribution substation SS registered in the investigation list (Step S103). Then, the search unit 19a searches a node corresponding to the position ID of the power distribution substation SS to which the selection is previously performed among the nodes stored in the node table 16a (Step S104).

Furthermore, the search unit 19a registers the record of the node searched from the node table 16a in the current node table 17a which is stored as the power distribution system information 17 in the storage unit 13 (Step S105). Furthermore, the search unit 19a registers the node searched from the node table 16a in the investigation list (Step S106).

Then, the search unit 19a selects one node registered in the investigation list (Step S107). Subsequently, the search unit 19a searches the record of the "branch" having a combination of the node IDs containing the node selected in Step S107 (that is, a combination of the node $ID_1$ and the node $ID_2$ among the "branches" stored in the "branch" table 16b (Step S108).

Furthermore, the search unit 19a registers the record of the "branch" searched in Step S108 in the current "branch" table 17b (Step S109). Furthermore, the search unit 19a registers the "branch" searched in Step S108 in the investigation list (Step S110). Subsequently, the search unit 19a selects one "branch" registered in the investigation list (Step S111).

Then, as illustrated in FIG. 23, the search unit 19a searches the attribute information corresponding to the facility ID of the "branch" selected in Step S111 from the "span" table 15b (Step S112). At this time, in a case where the attribute information is not possible to be searched from the "span" table 15b (that is, a case where the attribute information it not hit) (No in Step S113), the search unit 19a performs the following process.

In other words, the search unit 19a searches the attribute information corresponding to the facility ID of the "branch" selected from the "unit" table 15a in Step S111 (Step S114). Further, in a case where the attribute information is possible to be searched from the "span" table 15b (Yes in Step S113), the procedure skips the process of Step S114 and moves to the process of Step S115.

Then, the association unit 19b registers the attribute information of the "branch" in association with the record of the subject "branch" used in the search of the "span" table 15b or the "unit" table 15a among the records stored in the current "branch" table 17b (Step S115).

Thereafter, the search unit 19a determines whether the other node paring with the node investigated in Step S108 among the combinations of the nodes containing the "branch" searched in Step S108 is a blank (Step S116).

At this time, in a case where the other node is not a blank (No in Step S116), the search unit 19a further determines whether the subject "branch" is a switch (Step S117). Then, in a case where the "branch" is a switch (Yes in Step S117), the search unit 19a further determines whether the switch is in the close state (that is, whether the switch is in the ON state) (Step S118).

Herein, in a case where the switch is the ON state (Yes in Step S118), the search unit 19a searches the record of the other node from the node table 16a and then registers the other node in the current node table 17a of the power distribution system information 17 (Step S119). Furthermore, the search unit 19a adds the other node to the investigation list as the uninvestigated node (Step S120).

In addition, even in a case where the "branch" is not a switch (No in Step S117), the search unit 19a searches the record of the other node from the node table 16a and then registers the other node in the current node table 17a of the power distribution system information 17 (Step S119). Furthermore, the search unit 19a adds the other node to the investigation list as the uninvestigated node (Step S120).

On the other hand, in a case where the other node is a blank or in a case where the switch is in the OFF state (Yes in Step S116 or No in Step S118), the procedure proceeds to the process of Step S121.

Thereafter, the search unit 19a determines whether all the "branches" registered in the investigation list are investigated (Step S121). At this time, in a case where some of the "branches" registered in the investigation list are not investigated (No in Step S121), the uninvestigated "branch" is selected (Step S111) and then the processes from Step S112 to Step S121 are repeatedly performed.

Then, when all the "branches" registered in the investigation list are investigated (Yes in Step S121), the search unit 19a determines whether all the nodes registered in the investigation list are investigated (Step S122). At this time, in a case where some of the nodes registered in the investigation list are not investigated (No in Step S122), the uninvestigated node is selected (Step S107) and then the processes from Step S108 to Step S121 are repeatedly performed.

Thereafter, when all the nodes registered in the investigation list are investigated (Yes in Step S122), the search unit 19a determines whether all the position IDs of the power distribution substations SS registered in the investigation list are investigated (Step S123). At this time, in a case where some of the position IDs of the power distribution substations SS registered in the investigation list are not investigated (No in Step S123), the position ID of the uninvestigated power distribution substation SS is selected (Step S103) and then the processes from Step S104 to Step S122 are repeatedly performed.

Then, in a case were all the position IDs of the power distribution substations SS registered in the investigation list are investigated (Yes in Step S123), as illustrated in FIG. 24, the search unit 19a compares the record of the "branch" stored in the "branch" table 16b and the record of the "branch" stored in the current "branch" table 17b (Step S124).

Herein, in a case where the "branch" table 16b includes a record of the "branch" not matched with the current "branch" table 17b (Yes in Step S125), the search unit 19a detects the facility of the facility ID contained in the record of the subject "branch" as a blackout place (Step S126), and the process is ended. On the other hand, in a case where the "branch" table 16b has no record of the "branch" not matched with the current "branch" table 17b (No in Step S125), the process is ended without any action.

(2) Determination Process of Terminal Node

Figure 25:
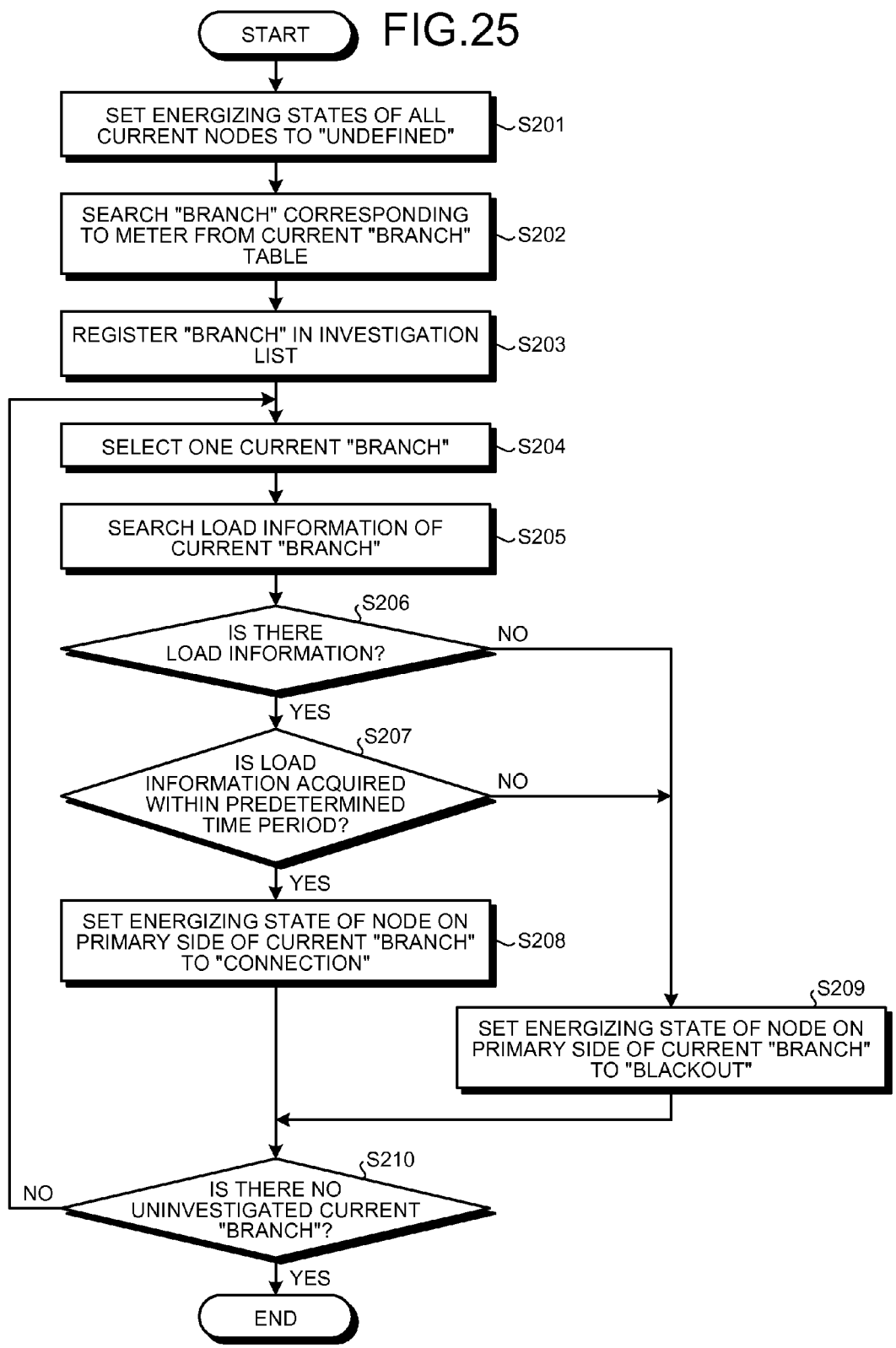
FIG. 25 is a flowchart illustrating a determination process of a terminal node according to the first embodiment.

FIG. 25 is a flowchart illustrating a determination process of the terminal node according to the first embodiment. This process is performed whenever a period set based on the sum of the meter reading interval and the transmission delay time elapses after the detection of the abnormal "branch" is performed at the last time.

As illustrated in FIG. 25, the detection unit 19d sets the energizing states of all the current nodes registered in the current node table 17a to be "Undefined" (Step S201). Then, the detection unit 19d searches the current "branch" having the facility ID of the load facility connected to the smart meter 50 from the current "branch" table 17b (Step S202).

Subsequently, the detection unit 19d registers the current "branch" searched from the current "branch" table 17b in the investigation list (Step S203). Thereafter, the detection unit 19*d* selects one current "branch" from the investigation list (Step S204). Subsequently, the detection unit 19*d* searches a record corresponding to the facility ID of the current "branch" on which the selection in Step S204 is performed, from the load table 18*a* (Step S205).

At this time, in a case where the record corresponding to the facility ID of the current "branch" is searched (Yes in Step S206), the detection unit 19*d* performs the following processes. In other words, the detection unit 19*d* determines whether the latest record among the records searched in Step S205 is acquired within a predetermined time period from the current time (for example, the meter reading interval "30 minutes" the transmission delay time "α") (Step S207).

Herein, in a case where the record is acquired within the predetermined time period (Yes in Step S207), the detection unit 19*d* sets the energizing state of the node (that is the terminal node) on the primary side of the current "branch" to be "Connection" (Step S208).

On the other hand, in a case where the record is not searched, or in a case where the record is searched but the latest record is not acquired within the predetermined time period from the current time (No in Step S206 or No in Step S207), the detection unit 19*d* sets the energizing state of the terminal node to be "Blackout" (Step S209).

Thereafter, until the uninvestigated current "branch" disappears from the investigation list (No in Step S210), the detection unit 19*d* repeatedly performs the processes from Step S204 to Step S209. Then, when the uninvestigated current "branch" disappears from the investigation list (Yes in Step S210), the process is ended.

(3) Determination Process of Connection Node

Figure 26:
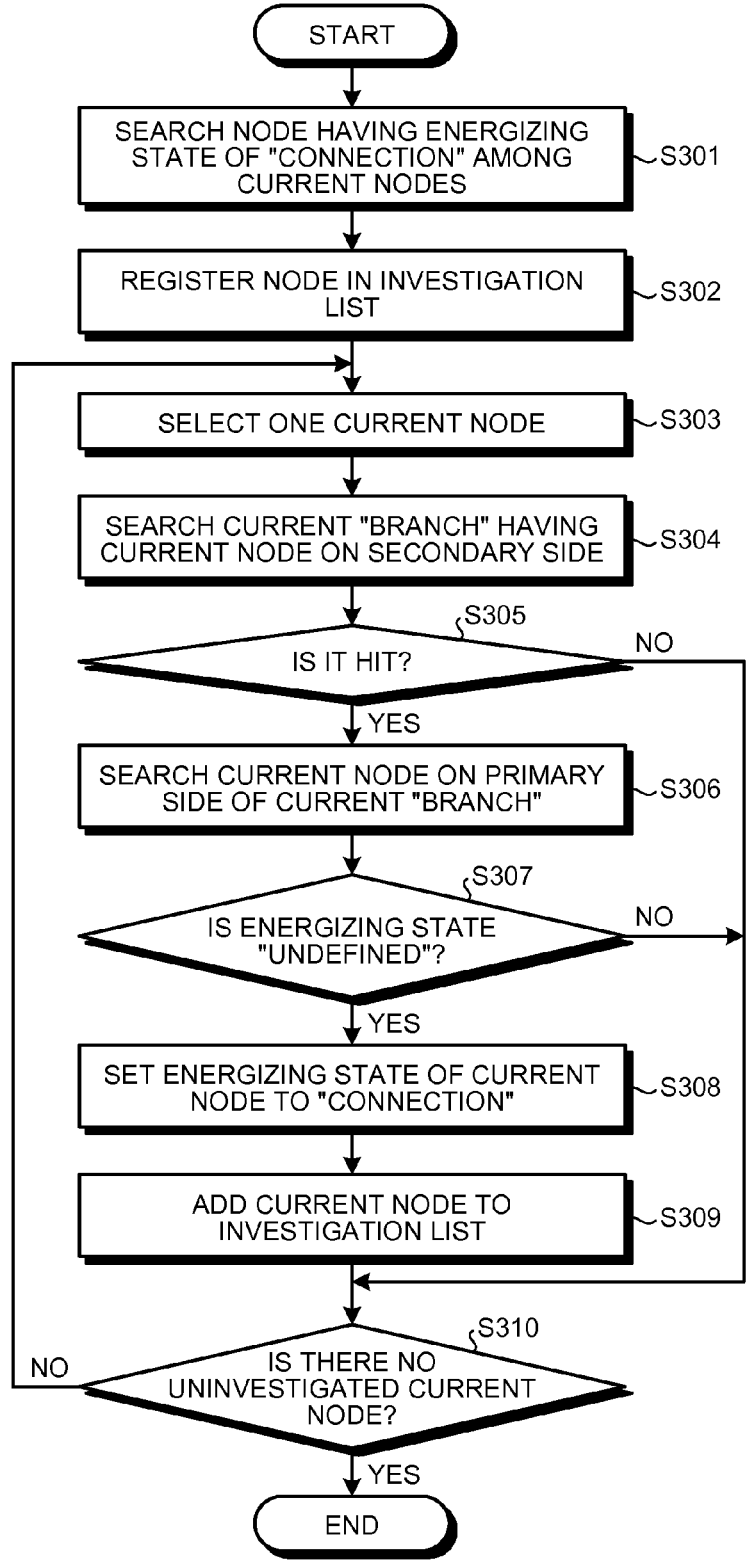
FIG. 26 is a flowchart illustrating a determination process of an energizing node according to the first embodiment.

FIG. 26 is a flowchart illustrating the determination process of the connection node according to the first embodiment. This process is performed in a case where the process illustrated in FIG. 25 is ended. As illustrated in FIG. 26, the detection unit 19*d* searches a terminal node of which the energizing state is set to "Connection" among the current nodes registered in the current node table 17*a* (Step S301).

Thereafter, the detection unit 19*d* registers the current node searched from the current node table 17*a* in the investigation list (Step S302). Subsequently, the detection unit 19*d* selects one current node from the investigation list (Step S303).

Subsequently, the detection unit 19*d* searches the current "branch" having the current node selected in Step S303 on the secondary side among the current "branches" registered in the current "branch" table 17*b* (Step S304).

Then, in a case where the current "branch" is searched from the current "branch" table 17*b* (Yes in Step S305), the detection unit 19*d* searches the current node on the primary side of the current "branch" (Step S306).

Subsequently, in a case where the energizing state of the current node on the primary side is set to "Undefined" (Yes in Step S307), the detection unit 19*d* sets the energizing state of the current node on the primary side to be "Connection" (Step S308). Then, the detection unit 19*d* additionally registers the current node on the primary side in the investigation list (Step S309).

In addition, in a case where the current "branch" is not searched, or in a case where the energizing state of the current node on the primary side is not set to "Undefined" (No in Step S305 or No in Step S307), the procedure proceeds to the process of Step S310.

Thereafter, until the uninvestigated current node disappears from the investigation list No in Step S310), the detection unit 19*d* repeatedly performs the processes from Step S303 to Step S309. Then, when the uninvestigated current node disappears from the investigation list (Yes in Step S310), the process is ended.

(4) Determination Process of Blackout Node

Figure 27:
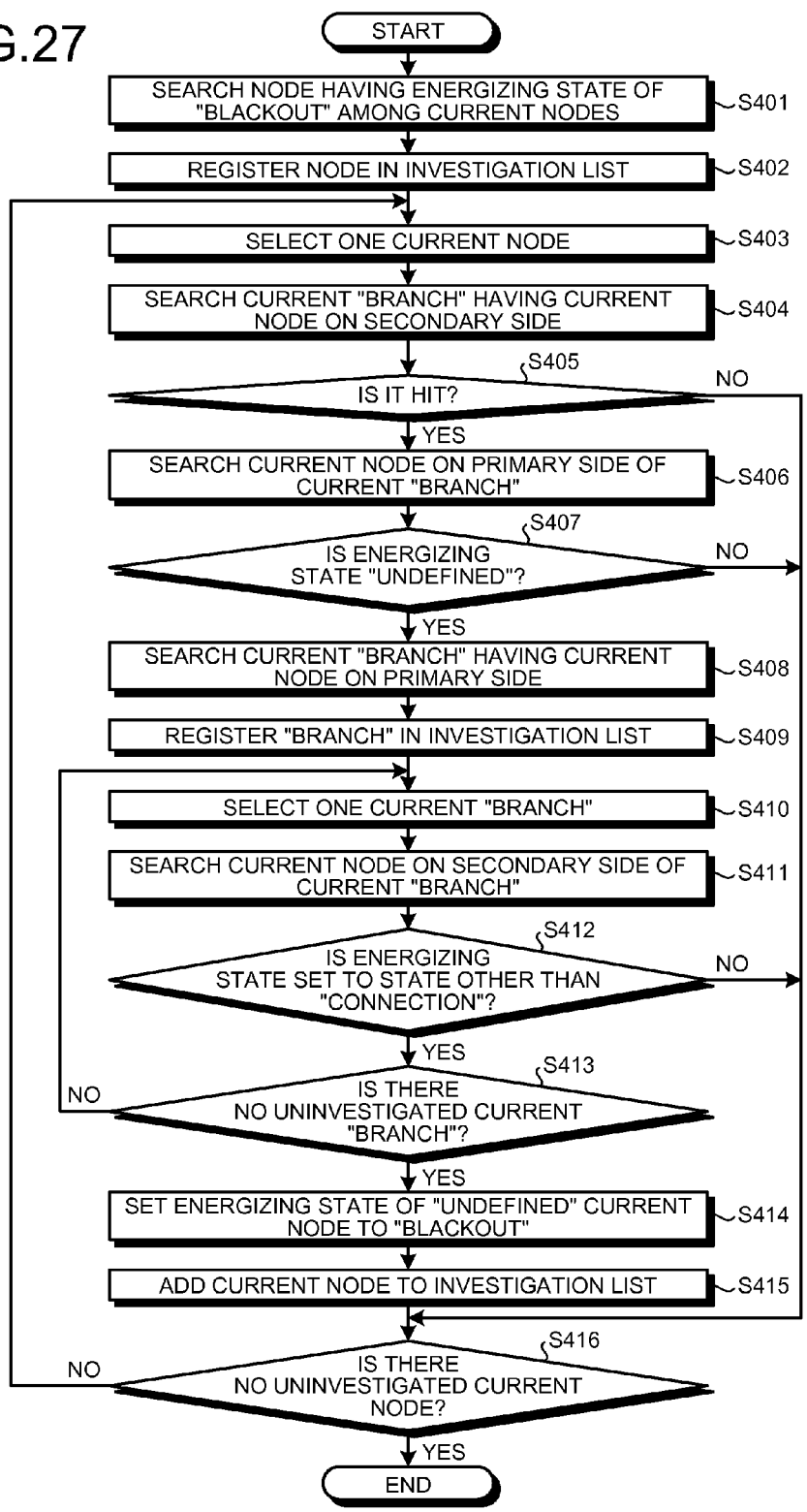
FIG. 27 is a flowchart illustrating a determination process of a blackout node according to the first embodiment.

FIG. 27 is a flowchart illustrating the determination process of the blackout node according to the first embodiment. This process is performed in a case where the process illustrated in FIG. 26 is ended. As illustrated in FIG. 27, the detection unit 19*d* searches the terminal node in which the energizing state of the terminal node is set to "Blackout" among the current nodes registered in the current node table 17*a* (Step S401).

Thereafter, the detection unit 19*d* registers the current node (that is, the terminal node) searched from the current node table 17*a* in the investigation list (Step S402). Subsequently, the detection unit 19*d* selects one current node from the investigation list (Step S403).

Subsequently, the detection unit 19*d* searches the current "branch" having the current node selected in Step S403 on the secondary side among the current "branches" registered in the current "branch" table 17*b* (Step S404).

Then, in a case where the current "branch" is searched from the current "branch" table 17*b* (Yes in Step S405), the detection unit 19*d* searches the current node on the primary side of the current "branch" from the current node table 17*a* (Step S406). Further, in a case where the current "branch" is not searched No in Step S405), the procedure proceeds to Step S416 while not performing the subsequent processes from Step S406 to Step S415.

At this time, in a case where the energizing state of the current node on the primary side is set to "Undefined" (Yes in Step S407), the detection unit 19*d* searches the current "branch" having the current node of which the energizing state is set to "Undefined" on the primary side from the current "branch" table 17*b* (Step S408). Further, in a case where the energizing state of the current node on the primary side is not set to "Undefined" (No in Step S407), the procedure proceeds to Step S416 while not performing the subsequent processes from Step S408 to Step S415.

Thereafter, the detection unit 19*d* registers the current "branch" searched from the current "branch" table 17*b* in the investigation list (Step S409). Subsequently, the detection unit 19*d* selects one current "branch" from the investigation list (Step S410). Then, the detection unit 19*d* searches the current node on the secondary side of the current "branch" selected from the current node table 17*a* in Step S410 (Step S411).

Subsequently, the detection unit 19*d* determines whether the energizing state of the current node on the secondary side of searched from the current node table 17*a* is set to a state other than "Connection" (Step S412). Then, in a case where the energizing state of the current node on the secondary side is set to a state other than "Connection" (Yes in Step S412), the detection unit 19*d* repeatedly performs the processes from Step S410 to Step S412 until the uninvestigated current "branch" disappears from the investigation list (No in Step S413). Further, in a case where the energizing state of the current node on the secondary side is set to "Connection" (No in Step S412), the procedure proceeds to Step S416.

Then, in a case where the energizing states on the secondary side of all the current nodes having the current node of which the energizing state is set to "Undefined" on the primary side are set to a state other than "Connection" (Yes in Step S413), the detection unit 19*d* sets the energizing state of the current node of which the energizing state is "Undefined" to "Blackout" (Step S414). Then, the detection unit 19d additionally registers the current node in the investigation list (Step S415).

Then, the detection unit 19d repeatedly performs the processes from Step S403 to Step S415 until the uninvestigated current node disappears from the investigation list (No in Step S416). Thereafter, when the uninvestigated current node disappears from the investigation list (Yes in Step S416), the process is ended.

(5) Detection Process of Abnormal "Branch"

Figure 28:
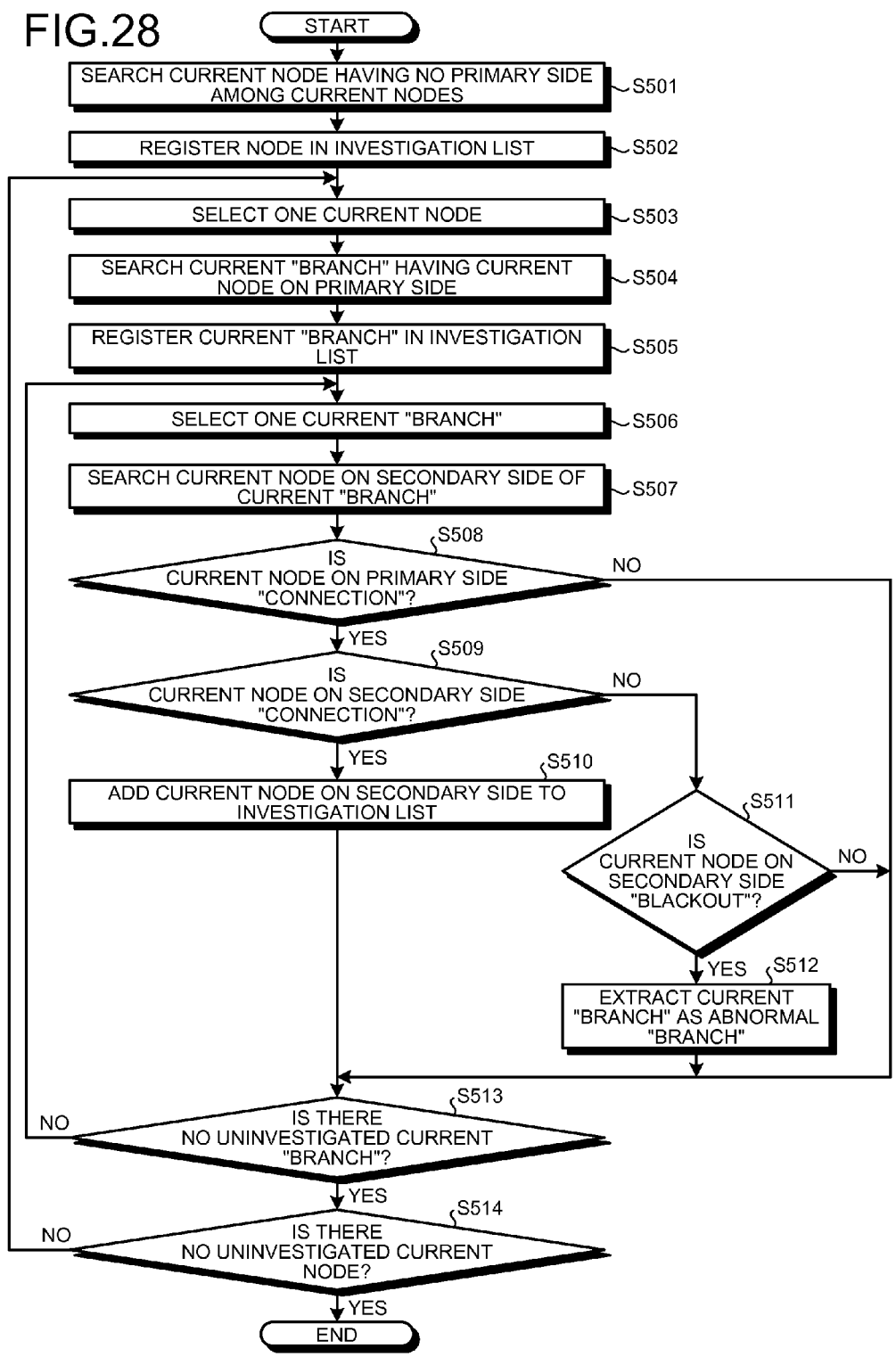
FIG. 28 is a flowchart illustrating a detection process of an abnormal "branch" according to the first embodiment.

FIG. 28 is a flowchart illustrating the detection process of the abnormal "branch" according to the first embodiment. This process is performed in a case where the process illustrated in FIG. 27 is ended. As illustrated in FIG. 28, the detection unit 19d searches the current node having no primary side among the current nodes registered in the current node table 17a (Step S501).

Thereafter, the detection unit 19d registers the current node (that is the uppermost node) searched from the current node table 17a in the investigation list (Step S502). Subsequently, the detection unit 19d selects one current node from the investigation list (Step S503).

Then, the detection unit 19d searches the current "branch" having the current node selected in Step S503 on the primary side from the current "branch" table 17b (Step S504). Thereafter, the detection unit 19d registers the current "branch" searched from the current "branch" table 17b in the investigation list (Step S505).

Subsequently, the detection unit 19d selects one current "branch" from the investigation list (Step S506). Thereafter, the detection unit 19d further searches the current node on the secondary side of the current "branch" selected from the investigation list (Step S507).

Herein, since the energizing state of the current node on the primary side of the current "branch" selected from the investigation list is "Connection" and the energizing state of the current node on the secondary side is also "Connection" (Yes in Step S508 and Yes in Step S509), it can be seen that the subject current "branch" is not disconnected. In this case, the detection unit 19d additionally registers the current node on the secondary side of the current "branch" in the investigation list (Step S510).

On the other hand, since the energizing state on the primary side of the current "branch" selected from the investigation list is "Connection" and the energizing state of the current node on the secondary side is "Blackout" (Yes in Step S508, No in Step S509, and Yes in Step S511), it is determined that the current "branch" is a "branch" having the connection node and the blackout node and the subject current "branch" is disconnected. In this case, the detection unit 19d detects the subject current "branch" as the "abnormal "branch"" (Step S512).

In addition, in a case where the energizing state of the current node on the primary side of the current "branch" selected from the investigation list is not "Connection", or in a case where the energizing state of the current node on the secondary side is "Undefined" (No in Step S508 or No in Step S511), the procedure proceeds to the process of Step S513.

Thereafter, until the uninvestigated current "branch" disappears from the investigation list (No in Step S513), the detection unit 19d repeatedly performs the processes from Step S506 to Step S512. Then, when the uninvestigated current "branch" disappears from the investigation list (Yes in Step S513), until the uninvestigated current node disappears from the investigation list (No in Step S514), the processes from Step S503 to Step S513 are repeatedly performed. Thereafter, when the uninvestigated current node disappears from the investigation list (Yes in Step S514), the process is ended.

Effects of First Embodiment

As described above, in a case where the power consumption is not acquired from all the smart meters 50 in a group within the predetermined time period, the power distribution management apparatus 10 according to the present embodiment detects, as an abnormal item, the facility of the power distribution system associated with the group. Therefore, in the power distribution management apparatus 10 according to the present embodiment, the abnormality detection target is not limited to the high-voltage system, and the abnormality detection range is not limited to a unit of the open/close division unlike the related art described above. Therefore, with the power distribution management apparatus 10 according to the present embodiment, it is possible to specify the abnormal item of the power distribution system.

Second Embodiment

Hitherto, the embodiment of the disclosed apparatus has been described, but the invention may be implemented in various different forms other than the embodiment described above. In the following, another embodiment belonging to the invention will be described.

Difference of Electricity Usage Amount

For example, in a case where the power consumption is acquired from the smart meter 50, the power distribution management apparatus 10 determines whether there is a change with respect to the power consumption acquired at the last time. At this time, in a case where there is no difference with respect to the power consumption acquired at the last time, the power distribution management apparatus 10 may detect the customers load facility connected to the smart meter 50 as the abnormal item.

In other words, even in a case where the load facility of the customer is not operated, the power is consumed just by energizing the load facility. Furthermore, the load facility of the customer includes a load facility which periodically operates such as a refrigerator. In this way, it is not considered that the electricity usage amount is zero unless the power of the facility is out. Therefore, in the power distribution management apparatus 10, in a case where the energizing state of the terminal node between the load facility connected to the smart meter 50 and the facility included in the power distribution system is "Connection", when there is no change with respect to the power consumption acquired at the last time, it may be determined that the switch of the breaker or the like of the distribution board of the customer is likely to be turned off. Accordingly, it is possible to specify the abnormal item even in a case where the load facility of the customer is abnormal.

At this time, the power distribution management apparatus 10 may determine whether there is a change with respect to the power consumption acquired at the last time of a customer's load facility for which a contract is made with the electric power provider. With this configuration, in a case where the power of the load facility of an installation on which no contract is made for the power usage is not used, it is possible to suppress that the load facility is detected as the abnormal item, and it is possible to also detect whether an installation having no contract for the power usage is used without permission.

Distribution and Integration

In addition, the respective depicted components are not necessarily configured as physically illustrated in the drawings. In other words, a specific pattern of distribution and integration of the respective apparatuses is not limited to the pattern illustrated in the drawing, but some or all of them may be mechanically or physically distributed/integrated in an arbitrary unit according to various loads or usage conditions. For example, the search unit 19a, the association unit 19b, the acquisition unit 19c, the detection unit 19d, or the output unit 19e may be provided as an external apparatus of the power distribution management apparatus 10 to be connected through a network. In addition, the search unit 19a, the association unit 19b, the acquisition unit 19c, the detection unit 19d, or the output unit 19e may be provided in an individual apparatus, and the function of the power distribution management apparatus 10 may be realized by connecting these apparatuses through the network to operate in cooperation with each other.

Abnormality Detection Program

In addition, the various types of processes described in the above embodiment may be realized by executing a program prepared beforehand using a computer such as a personal computer or a workstation. In the following, using FIG. 29, an example of the computer which executes the abnormality detection program having the same functions as the above embodiment will be described.

Figure 29:
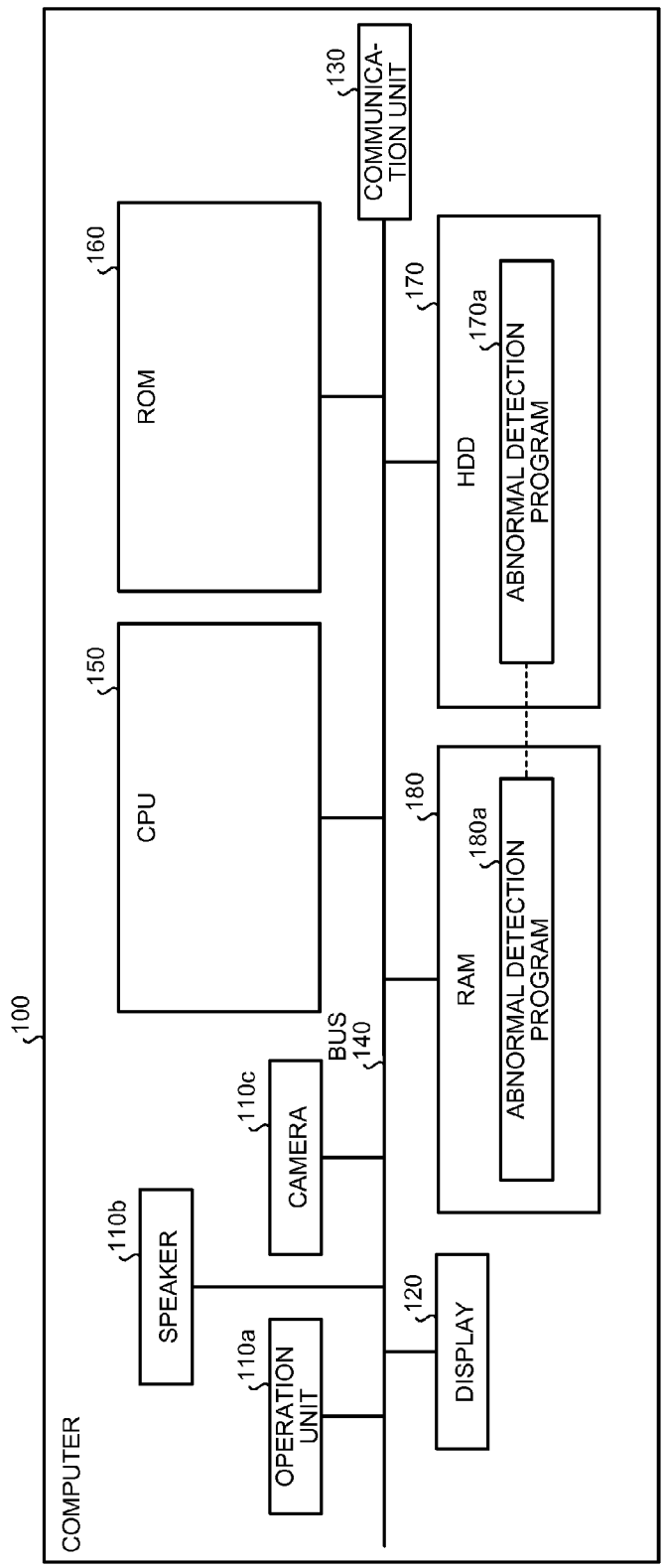
FIG. 29 is a diagram fox describing an example of a computer which executes an abnormal detection program according to the first embodiment and a second embodiment.

FIG. 29 is a diagram for describing an example of the computer which executes the abnormality detection program according to the first embodiment and the second embodiment. As illustrated in FIG. 29, a computer 100 includes an operation unit 110a, a speaker 110b, a camera 110c, a display 120, and a communication unit 130. Furthermore, the computer 100 includes a CPU 150, ROM 160, an HDD 170, and RAM 180. These components 110 to 180 are connected to each other through a bus 140.

As illustrated in FIG. 29, an abnormality detection program 170a which performs the same functions as the search unit 19a, the association unit 19b, the acquisition unit 19c, the detection unit 19d, and the output unit 19e illustrated in the first embodiment is stored in the HDD 170 beforehand. The abnormality detection program 170a may be appropriately integrated or divided similarly to the respective elements of the search unit 19a, the association unit 19b, the acquisition unit 19c, the detection unit 19d, and the output unit 19e illustrated in FIG. 1. In other words, all the data to be stored in the HDD 170 is not necessarily stored in the HDD 170, and only data used for the process may be stored in the HDD 170.

Then, the CPU 150 reads the abnormality detection program 170a out of the HDD 170 and develops the program in the RAM 180. Therefore, as illustrated in FIG. 29, the abnormality detection program 170a functions as an abnormality detection process 180a. The abnormality detection process 180a develops various types of data read out of the HDD 170 in an area appropriately allocated for its own sake on the RAM 180, and performs various types or processes based on the various types of developed data. Further, the abnormality detection process 180a includes the processes (for example, the processes illustrated in FIGS. 22 to 28) performed by the search unit 19a, the association unit 19b, the acquisition unit 19c, the detection unit 19d, and the output unit 19e illustrated in FIG. 1. In addition, all the respective processing units virtually realized on the CPU 150 are always not necessarily operated on the CPU 150, and only the processing units required for the process may be virtually realized.

Further, the abnormality detection program 170a is not always stored in the HDD 170 or the ROM 160 from the beginning. For example, the respective programs may be stored in a "portable physical medium" (what is called an FD, a CD-ROM, a DVD disk, a magneto-optical disk, an IC card, and the like) of a flexible disk inserted in the computer 100. Then, the computer 100 may acquire the respective programs from the portable physical mediums and execute the programs. In addition, the respective programs are stored in another computer or a server apparatus connected to the computer 100 through a public line, the Internet, a LAN, a WAN, and the like, and the computer 130 may acquire and execute these programs.

According to an aspect of an embodiment, it is possible to specify an abnormal item in a power distribution system.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power distribution management apparatus comprising:
   an electrical connection storage unit configured to store electrical connection information in which a combination of junctions at which a plurality of facilities included in a power distribution system are electrically connected to each other and a facility determined by the combination of the junctions are associated, the facility being a branch that connects a junction to another junction constituting the combination of the junctions,
   an acquisition unit configured to acquire a first junction corresponding to a first facility from which predetermined data is acquired within a predetermined interval and a second junction corresponding to a second facility from which the predetermined data is not acquired within the predetermined interval; and
   a detection unit configured to firstly detect, as normal items, junctions located between the first junction and a power-supplying facility of a power distribution system, secondly detect, as abnormal items, junctions other than junctions detected at the first detecting as the normal items among junctions located between the second junction and the power-supplying facility of the power distribution system, and specify an abnormal item of the power distribution system in a narrower range than a section partitioned by switches without limiting an abnormality detection target to a high-voltage system and limiting an abnormality detection range to a unit of an open/close division.

2. The power distribution management apparatus according to claim 1, further comprising:

an output unit configured to output information of an abnormal item which is detected by the detection unit.

3. The power distribution management apparatus according to claim 2,
wherein the output unit outputs information of the abnormal item and the junctions in the abnormal item located between meters and the facility near a customer's load facility as an abnormal influence range.

4. The power distribution management apparatus according to claim 2, further comprising:
a position storage unit configured to store position information in which a first facility, which is a unit provided not by installation, among facilities and a position of the first facility are associated,
wherein a position of the first facility among the positions contained in the position information is further associated with the first facility among the facilities contained in electrical connection information,
wherein positions of the first facilities corresponding to both end portions of an installation facility, which is a span provided by installation, among the positions contained in the position information are associated with the installation facilities provided by installation among the facilities contained in the electrical connection information,
wherein when the facility is the first facility by referring to the electrical connection information, the output unit uses a position of the first facility, and
wherein when the facility is the installation facility, the output unit uses the positions of both end portions of the installation facility to generate display data in which the first facility and the installation facility are arranged on a map and a display representation of a facility corresponding to the abnormal item is distinguished from the display representation of another facility.

5. The power distribution management apparatus according to claim 1, further comprising:
a determination unit configured, when power consumption as the data is acquired from meters, to determine whether there is a change with respect to power consumption contained in the data acquired at the last time,
wherein when there is no change with respect to the power consumption acquired at the last time, the detection unit detects a customer's load facility connected to meters as an abnormal item.

6. An abnormality detection method which is executed by a computer,
wherein the method causes the computer to perform
storing electrical connection information in which a combination of junctions at which a plurality of facilities included in a power distribution system are electrically connected to each other and a facility determined by the combination of the junctions are associated, the facility being a branch that connects a junction to another junction constituting the combination of the junctions,
acquiring a first junction corresponding to a first facility from which predetermined data is acquired within a predetermined interval and a second junction corresponding to a second facility from which the predetermined data is not acquired within the predetermined interval; and
first detecting, as normal items, junctions located between the first junction and a power-supplying facility of a power distribution system, second detecting, as abnormal items, junctions other than junctions detected at the first detecting as the normal items among junctions located between the second junction and the power-supplying facility of the power distribution system, and specifying an abnormal item of the power distribution system in a narrower range than a section partitioned by switches without limiting an abnormality detection target to a high-voltage system and limiting an abnormality detection range to a unit of an open/close division.

7. The abnormality detection method according to claim 6,
wherein the computer further performs a process of outputting information of the abnormal item.

8. The abnormality detection method according to claim 7,
wherein as the process of outputting information of the abnormal item,
a process of outputting, as an abnormal influence range, information of the abnormal item and the junctions in the abnormal item located between meters and the facility near a customer's load facility.

9. The abnormality detection method according to claim 7,
wherein in a first facility, which is a unit provided not by installation, among facilities contained in electrical connection information, a position of the first facility is further associated among positions contained in position information in which the first facility and a position of the first facility are associated,
wherein positions of the first facilities corresponding to both end portions of the installation facility, which is a span provided by installation, among the positions contained in the position information are associated with the installation facilities provided by installation among the facilities contained in the electrical connection information, and
wherein as a process of outputting information of the abnormal item,
a process of arranging the first facility and the installation facility on a map and generating display data in which a display representation of the facility corresponding to the abnormal item is distinguished from that of another facility using the position of the first facility is performed when the facility is the first facility by referring to the electrical connection information, and using the positions of both end portions of the installation facility when the facility is the installation facility.

10. The abnormality detection method according to claim 6,
wherein when power consumption as the data is acquired from meters, the computer further performs a process of determining whether there is a change with respect to power consumption contained in data acquired at the last time, and
wherein as a process of detecting the abnormal item,
when there is no change with respect to the power consumption acquired at the last time, a process of detecting a customer's load facility connected to meters as the abnormal item is performed.

11. A non-transitory computer-readable recording medium having stored therein a program for abnormality detection for causing a computer to execute a process comprising:
storing electrical connection information in which a combination of junctions at which a plurality of facilities included in a power distribution system are electrically connected to each other and a facility determined by the combination of the junctions are associated, the facility being a branch that connects a junction to another junction constituting the combination of the junctions, acquiring a first junction corresponding to a first facility from which predetermined data is acquired within a predetermined interval and a second junction corresponding to a second facility from which the predetermined data is not acquired within the predetermined interval; and first detecting, as normal items, junctions located between the first junction and a power-supplying facility of a power distribution system, second detecting, as abnormal items, junctions other than junctions detected at the first detecting as the normal items among junctions located between the second junction and the power-supplying facility of the power distribution system, and specifying an abnormal item of the power distribution system in a narrower range than a section partitioned by switches without limiting an abnormality detection target to a high-voltage system and limiting an abnormality detection range to a unit of an open/close division.

12. The non-transitory computer-readable recording medium according to claim 11, wherein the process further comprises outputting information of the abnormal item.

* * * * *